US010656170B2

(12) United States Patent
Lim et al.

(10) Patent No.: US 10,656,170 B2
(45) Date of Patent: May 19, 2020

(54) MAGNETIC FIELD SENSORS AND OUTPUT SIGNAL FORMATS FOR A MAGNETIC FIELD SENSOR

(71) Applicant: Allegro MicroSystems, LLC, Manchester, NH (US)

(72) Inventors: Hyungsok Lim, Seongnam-si (KR); Haeyoung Choi, Nashua, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 155 days.

(21) Appl. No.: 15/982,268

(22) Filed: May 17, 2018

(65) Prior Publication Data
US 2019/0353677 A1    Nov. 21, 2019

(51) Int. Cl.
*G01P 3/487* (2006.01)
*H01L 43/10* (2006.01)
*H01L 43/06* (2006.01)
*G01P 21/02* (2006.01)

(52) U.S. Cl.
CPC .............. *G01P 3/487* (2013.01); *G01P 21/02* (2013.01); *H01L 43/06* (2013.01); *H01L 43/10* (2013.01)

(58) Field of Classification Search
CPC ........ G01P 3/487; G01P 21/02; G01P 13/045; H01L 43/06; H01L 43/10; G01D 5/145
USPC .................. 324/174, 173, 166, 160
See application file for complete search history.

(56) References Cited

U.S. PATENT DOCUMENTS

| 3,304,434 A | 2/1967 | Koster |
| 4,225,939 A | 9/1980 | Yashiro |
| 4,283,679 A | 8/1981 | Ito et al. |
| 4,513,403 A | 4/1985 | Troy |
| 4,642,555 A | 2/1987 | Swartz et al. |
| 4,649,796 A | 3/1987 | Schmidt |
| 4,893,027 A | 1/1990 | Kammerer et al. |
| 5,244,834 A | 9/1993 | Suzuki et al. |
| 5,332,956 A | 7/1994 | Oh |

(Continued)

FOREIGN PATENT DOCUMENTS

| DE | 25 18 054 | 11/1976 |
| DE | 40 31 560 | 4/1992 |

(Continued)

OTHER PUBLICATIONS

European 161/162 Communication dated Jun. 6, 2019 for European Application No. 17809079.1; 3 Pages.

(Continued)

*Primary Examiner* — Giovanni Astacio-Oquendo
(74) *Attorney, Agent, or Firm* — Daly, Crowley, Mofford & Durkee, LLP

(57) ABSTRACT

An apparatus and a method provide an output signal indicative of a speed of rotation and/or a direction of movement of a ferromagnetic object having ferromagnetic features and capable of moving. A variety of signal formats of the output signal are described, each of which have pulses at a rate faster than the ferromagnetic features pass by the magnetic field sensor. The magnetic field sensor includes a plurality of diagnostic circuits that detect a failure of the magnetic field sensor and output a diagnostic signal indicative of the failure. The controller can receive the diagnostic signals and generate a sensor output signal including a failure state to indicate the detected failure.

24 Claims, 13 Drawing Sheets

(56) References Cited

U.S. PATENT DOCUMENTS

| | | | |
|---|---|---|---|
| 5,486,759 A | 1/1996 | Seiler et al. | |
| 5,696,790 A | 12/1997 | Graham et al. | |
| 5,781,005 A | 7/1998 | Vig et al. | |
| 6,181,127 B1* | 1/2001 | Wallrafen | G01B 7/14 |
| | | | 324/163 |
| 6,212,783 B1 | 4/2001 | Ott et al. | |
| 6,242,604 B1 | 6/2001 | Hudlicky et al. | |
| 6,242,904 B1 | 6/2001 | Shirai et al. | |
| 6,242,905 B1 | 6/2001 | Draxelmayr | |
| 6,242,908 B1 | 6/2001 | Scheller et al. | |
| 6,278,269 B1 | 8/2001 | Vig et al. | |
| 6,288,567 B1 | 9/2001 | Fink | |
| 6,297,627 B1 | 10/2001 | Towne et al. | |
| 6,339,322 B1 | 1/2002 | Loreck et al. | |
| 6,492,804 B2 | 12/2002 | Tsuge et al. | |
| 6,525,531 B2 | 2/2003 | Forrest et al. | |
| 6,542,847 B1 | 4/2003 | Lohberg et al. | |
| 6,653,968 B1 | 11/2003 | Schneider | |
| 6,687,644 B1 | 2/2004 | Zinke et al. | |
| 6,815,944 B2 | 11/2004 | Vig et al. | |
| 6,968,484 B2 | 11/2005 | Hummel | |
| 7,026,808 B2 | 4/2006 | Vig et al. | |
| 7,199,579 B2 | 4/2007 | Scheller et al. | |
| 7,295,000 B2 | 11/2007 | Werth | |
| 7,319,418 B2 | 1/2008 | Fink | |
| 7,345,468 B2 | 3/2008 | Okada et al. | |
| 7,362,094 B2 | 4/2008 | Voisine et al. | |
| 7,365,530 B2 | 4/2008 | Bailey et al. | |
| 7,592,801 B2 | 9/2009 | Bailey et al. | |
| 7,800,389 B2 | 9/2010 | Friedrich et al. | |
| 7,923,996 B2 | 4/2011 | Doogue et al. | |
| 8,030,918 B2 | 10/2011 | Doogue et al. | |
| 8,542,010 B2 | 9/2013 | Cesaretti et al. | |
| 8,577,634 B2 | 11/2013 | Donovan et al. | |
| 8,624,588 B2 | 1/2014 | Vig et al. | |
| 8,680,846 B2 | 3/2014 | Cesaretti et al. | |
| 8,754,640 B2 | 6/2014 | Vig et al. | |
| 8,860,404 B2 | 10/2014 | Dwyer et al. | |
| 8,994,369 B2 | 3/2015 | Vig et al. | |
| 9,068,859 B2 | 6/2015 | Dwyer et al. | |
| 9,151,771 B2 | 10/2015 | Vig et al. | |
| 9,172,565 B2 | 10/2015 | Cadugan et al. | |
| 9,201,122 B2 | 12/2015 | Cesaretti et al. | |
| 9,222,988 B2* | 12/2015 | Zhang | G01R 33/0029 |
| 9,222,990 B2 | 12/2015 | Dwyer et al. | |
| 9,300,235 B2 | 3/2016 | Ng et al. | |
| 9,806,650 B1* | 10/2017 | Chu | H02P 6/17 |
| 10,101,410 B2 | 10/2018 | Latham et al. | |
| 2001/0002791 A1 | 6/2001 | Tsuge et al. | |
| 2001/0009367 A1 | 7/2001 | Seitzer et al. | |
| 2002/0027488 A1 | 3/2002 | Hayat-Dawoodi et al. | |
| 2003/0001563 A1 | 1/2003 | Turner | |
| 2003/0141862 A1 | 7/2003 | Vig et al. | |
| 2004/0062362 A1 | 4/2004 | Matsuya | |
| 2004/0135220 A1 | 7/2004 | Goto | |
| 2005/0120782 A1 | 6/2005 | Kishibata et al. | |
| 2005/0179429 A1 | 8/2005 | Lohberg | |
| 2005/0225318 A1 | 10/2005 | Bailey et al. | |
| 2009/0058404 A1 | 3/2009 | Kurumado | |
| 2009/0251134 A1 | 10/2009 | Uenoyama | |
| 2010/0026279 A1 | 2/2010 | Vig et al. | |
| 2010/0211347 A1 | 8/2010 | Friedrich et al. | |
| 2011/0018533 A1 | 1/2011 | Cesaretti et al. | |
| 2013/0335069 A1 | 12/2013 | Vig et al. | |
| 2013/0335074 A1 | 12/2013 | Dwyer et al. | |
| 2014/0375312 A1* | 12/2014 | Friedrich | G01P 3/489 |
| | | | 324/259 |
| 2015/0185279 A1 | 7/2015 | Milano et al. | |
| 2015/0236746 A1 | 8/2015 | Scheinkerman et al. | |
| 2015/0236869 A1 | 8/2015 | Vreeland et al. | |
| 2015/0268263 A1 | 9/2015 | Rasbornig | |
| 2016/0025820 A1 | 1/2016 | Scheller et al. | |
| 2016/0123780 A1 | 5/2016 | Snyder et al. | |
| 2016/0139230 A1 | 5/2016 | Petrie et al. | |
| 2016/0178714 A1* | 6/2016 | Fautz | G01R 33/483 |
| | | | 324/309 |
| 2017/0219662 A1 | 8/2017 | Prentice et al. | |
| 2017/0319097 A1* | 11/2017 | Amthor | A61B 5/055 |
| 2017/0336225 A1 | 11/2017 | Burdette et al. | |
| 2018/0024214 A1* | 1/2018 | Bhat | G01R 33/5617 |
| | | | 324/309 |
| 2018/0067174 A1 | 3/2018 | Prentice et al. | |
| 2018/0136999 A1 | 5/2018 | Fernandez | |

FOREIGN PATENT DOCUMENTS

| | | |
|---|---|---|
| DE | 196 34 715 A1 | 3/1998 |
| DE | 19634714 B4 | 3/1998 |
| DE | 196 50 935 A1 | 6/1998 |
| DE | 198 38 433 | 3/1999 |
| DE | 19900774 A1 | 12/1999 |
| DE | 199 61 504 A1 | 6/2001 |
| EP | 0 944 888 A2 | 9/1999 |
| EP | 1 580 560 A1 | 9/2005 |
| EP | 1 662 353 A1 | 5/2006 |
| JP | 63-300911 | 12/1988 |
| JP | H 02-116753 | 5/1990 |
| JP | H 02-149013 | 6/1990 |
| JP | H 03-29817 | 2/1991 |
| JP | H06-273437 | 9/1994 |
| JP | 07-012582 | 1/1995 |
| JP | H 09-49740 | 2/1997 |
| JP | 10-332725 | 12/1998 |
| JP | 11-064363 | 3/1999 |
| JP | 2001-043475 | 2/2001 |
| JP | 2001-165951 | 6/2001 |
| JP | 2002-117500 | 4/2002 |
| JP | 2002-357920 | 12/2002 |
| JP | 4093381 | 3/2008 |
| JP | 4880874 | 2/2012 |
| WO | WO 88/09026 | 11/1988 |
| WO | WO 9825148 A2 | 6/1998 |
| WO | WO 99/49322 | 9/1999 |
| WO | WO 01/74139 A2 | 10/2001 |
| WO | WO 03/069358 A2 | 8/2003 |
| WO | WO 2004/010437 | 1/2004 |
| WO | WO 2005/013363 A2 | 2/2005 |
| WO | WO 2008/145662 A1 | 12/2008 |
| WO | WO 2009/012006 | 1/2009 |
| WO | WO 2009/121352 | 10/2009 |
| WO | WO 2010/014309 A1 | 2/2010 |
| WO | WO 2010/150416 | 12/2010 |

OTHER PUBLICATIONS

Response Korean with English translation of bibliographic information dated Jul. 26, 2019 for Korean Application No. 10-2014-7036300; 37 pages.

Letter from 21$^{st}$ Century Patent & Law Firm dated Jun. 28, 2019 for Korean Application No. 10-20147036300; 3 pages.

Notice of Allowance dated Sep. 30, 2019 for Korean Application No. 10-2014-7036300; 4 pages.

U.S. Appl. No. 15/655,377, filed Jul. 20, 2017, Kerdraon et al.

U.S. Appl. No. 62/337,478, filed May 17, 2016, Burdette et al.

Allegro Microsystems, Inc. Data Sheet A1341; "High Precision, Highly Programmable Linear Hall Effect Sensor IC with EEPROM, Output Protocols SENT and PWM, and Advanced Output Linearization Capabilities;" May 17, 2010; 46 pages.

Allegro Microsystems, Inc. Data Sheet ATS601LSG; "Non-TPOS, Tooth Detecting Speed Sensor;" Nov. 1, 2011; 9 pages.

Jeffrey et al.; "Sensor Testing Through Bias Superposition;" Science Direct, Sensors and Actuators, A 136; Feb. 6, 2007, 15 pages.

Infineon Technologies; "Differential Two-Wire Hall Effect Sensor IC;" TLE4942 Preliminary Datasheet; Jun. 2000; 12 pages.

Lequesne et al.; "High-Accuracy Magnetic Position Encoder Concept;" IEEE Transactions on Industry Applications; vol. 35, No. 3; May/Jun. 1999; 9 pages.

Robert Bosch GMBH Stuttgart; "Active Sensor for ABS/ASR/VDC-Systems with 2-Wire-Current Interface;" Specification TLE4941/TLE4942; Version 5; Jun. 25, 2000; 44 pages.

(56) References Cited

OTHER PUBLICATIONS

PCT Search Report dated Nov. 19, 2003 for PCT Pat. App. No. PCT/US03/02489; 5 pages.
PCT Invitation to Pay Additional Fees with Partial Search Report; dated Oct. 2, 2003 for PCT Pat. App. No. PCT/US03/02489; 3 pages.
EP Office Action dated Mar. 2, 2005 for EP 03 710 766.1; 8 pages.
EP Response to Office Action submitted May 2009 for EP 03 710 766.1; 19 pages.
Ep Summons to Oral Proceedings dated Apr. 30, 2009 for EP 03 710 766.1; 4 pages.
EP Communication from the Board of Appeal for EP 03 710 766.1; dated May 26, 2009; 52 pages.
JP Official Action dated Apr. 7, 2008 for JP 2003-568426; 5 pages.
JP Response to Official Action dated Sep. 22, 2008 for JP 2003-568426; 14 pages.
JP Official Action dated Dec. 12, 2008 for JP 2003-568426; 4 pages.
JP Response to Official Action dated Mar. 25, 2009 for JP 2003-568426; 8 pages.
JP Notice of Rejection dated Nov. 16, 2010; for JP 2003-568426; 5 pages.
JP Response to Notice of Rejection dated May 13, 2011; for JP 2003-568426; 27 pages.
JP Office Action dated Aug. 29, 2011; for JP 2003-568426; 9 pages.
JP Response to Notice of Rejection; filed Oct. 11, 2011; for JP 2003-568426; 6 pages.
JP Notice of Allowance dated Nov. 8, 2011; for JP 2003-568426; 3 pages.
U.S. Pat. No. 6,815,944; 175 pages.
U.S. Pat. No. 6,815,944; 143 pages.
U.S. Pat. No. 7,026,808; 177 pages.
EP Response to Written Opinion; dated Mar. 9, 2011; for EP Pat. App. No. 09789890.2; 11 pages.
CN Office Action dated May 3, 2012; for CN Pat. App. No. 200980189766.7; 13 pages.
CN Response to Office Action filed on Oct. 18, 2012; for CN Pat. App. No. 200980129766.7; 10 pages.
Letter to NTD Patent and Trademark Agency; dated Aug. 29, 2012; Chinese Pat. App. No. 200980129766.7; including U.S. Amendment filed May 19, 2012; 20 pages.
Letter from NTD Patent & Trademark Agency Limited; dated Feb. 6, 2013; for CN Pat. App. No. 200980129766.7; 2 pages.
Chinese Office Action dated Jan. 18, 2013; for CN Pat. App. No. 200980129766.7; 8 pages.
Letter to NTD Patent & Trademark Agency Limited; dated Feb. 6, 2013; for CN Pat. App. No. 200980129766.7; 2 pages.
Chinese Notice of Allowance; dated Mar. 6, 2013; for Chinese Pat. App. No. 200980129766.7; 4 pages.
Office Action dated May 12; 2011; for U.S. Appl. No. 12/183,367; 17 pages.
Response to Office Action filed Aug. 10, 2011; for U.S. Appl. No. 12/183,367; 13 pages.
Office Action dated Oct. 20, 2011; for U.S. Appl. No. 12/183,367; 9 pages.
Response to Office Action filed Jan. 17, 2012; for U.S. Appl. No. 12/183,367; 15 pages.
Restriction Requirement dated Apr. 12, 2012; for U.S. Appl. No. 12/183,367; 6 pages.
Response to Restriction Requirement filed May 9, 2012; for U.S. Appl. No. 12/183,367; 2 pages.
Final Office Action; dated May 2, 2013; for U.S. Appl. No. 12/183,367; 15 pages.
Response to Final Office Action dated Jun. 19, 2013 for U.S. Appl. No. 12/183,367 8 pages.
Final Office Action dated Jul. 1, 2013; for U.S. Appl. No. 12/183,367; 7 pages.
Response to Final Office Action dated Aug. 27, 2013 for U.S. Appl. No. 12/183,367; 13 pages.
Notice of Allowance dated Sep. 6, 2013 for U.S. Appl. No. 12/183,367; 7 pages.
U.S. Appl. No. 12/183,367; Part 1; 175 pages.
U.S. Appl. No. 12/183,367; Part 2; 175 pages.
U.S. Appl. No. 12/183,367; Part 3; 175 pages.
U.S. Appl. No. 12/183,367; Part 4; 175 pages.
U.S. Appl. No. 12/183,367; Part 5; 175 pages.
U.S. Appl. No. 12/183,367; Part 6; 175 pages.
U.S. Appl. No. 12/183,367; Part 7; 175 pages.
U.S. Appl. No. 12/183,367; Part 8; 175 pages.
U.S. Appl. No. 12/183,367; Part 9; 148 pages.
Notice of Allowance dated Feb. 12, 2014 for U.S. Appl. No. 13/526,106; 10 pages.
PCT Search Report and Written Opinion of the ISA; dated Aug. 12, 2013; for PCT Pat. App. No. PCT/US2013/044025; 12 pages.
PCT International Preliminary Report on Patentability dated Dec. 31, 2014 for PCT Pat. App. No. PCT/US2013/044025; 10 pages.
Voluntary Amendment filed Feb. 7, 2018 for Korean Application No. 10-2014-7036300; 12 pages.
Response to Written Opinion filed Jun. 29, 2015 for European Application No. 13729203.3; 43 pages.
Intention of Grant dated Jan. 19, 2017 for European Application No. 13729203.3; 2 pages.
Office Action dated Apr. 19, 2018 for U.S. Appl. No. 15/350,400; 18 pages.
Response to Office Action filed on May 9, 2018 2018 for U.S. Appl. No. 15/350,400; 18 pages.
Final Office Action dated Aug. 6, 2018 for U.S. Appl. No. 15/350,400; 24 pages.
Response to Final Office Action filed on Nov. 5, 2018 2018 for U.S. Appl. No. 15/350,400; 18 pages.
Notice of Allowance dated Nov. 21, 2018 for U.S. Appl. No. 15/350,400; 7 pages.
PCT International Search Report and Written Opinion dated Mar. 8, 2018 for International Application No. PCT/US2017/059148; 16 pages.
ISO 26262-1 "Road Vehicles—Functional Safety, Part 1 Vocabulary", International Standard, Nov. 15, 2011, 30 pages.
ISO 26262-3 "Road Vehicles—Functional Safety, Part 3 Concept Phase", International Standard, Nov. 15, 2011, 32 pages.
ISO 26262-10 "Road Vehicles—Functional Safety, Part10 Guideline on ISO 26262", International Standard, Aug. 1, 2012, 96 pages.
PCT International Preliminary Report dated May 23, 2019 for Intl. Pat. Appl. No, PCT/US2017/059148; 9 pages.
Response to Office Action filed on Dec. 16, 2019 for European Application No. 17809079.1; 28 pages.
KR Notice to Submit a Response dated May 29, 2019 for KR Pat. Appl. No. 10-2014-7036300; 8 pages.

\* cited by examiner

MAGNETIC FIELD SENSORS AND OUTPUT SIGNAL FORMATS FOR A MAGNETIC FIELD SENSOR

CROSS REFERENCE TO RELATED APPLICATIONS

Not Applicable.

STATEMENT REGARDING FEDERALLY SPONSORED RESEARCH

Not Applicable.

FIELD

This disclosure relates generally to integrated circuits and, more particularly, to magnetic field sensors for detecting and communicating a speed of rotation and/or a direction of rotation of a ferromagnetic object.

BACKGROUND

Proximity detectors for detecting ferromagnetic objects are known. In proximity detectors, the magnetic field associated with the ferromagnetic object is detected by a magnetic field sensing element, such as a Hall effect element or a magnetoresistance element, which provides a signal (i.e., a magnetic field signal or sensing element signal) proportional to a detected magnetic field.

Some types of magnetic field sensors, i.e., proximity detectors, merely provide an output signal representative of the proximity of the ferromagnetic object. However, other types of magnetic field sensors, i.e., rotation detectors, provide an output signal representative of the approach and retreat of each tooth of a rotating ferromagnetic gear or of each segment of a segmented ring magnet having segments with alternating polarity as the gear or ring magnet rotates. The rotation detector processes the magnetic field signal to generate an output signal that changes state each time the magnetic field signal either reaches a value near to a peak (positive or negative peak) or crosses a threshold level. Therefore, the output signal, which has an edge rate or period, is indicative of a rotation and a speed of rotation of the ferromagnetic gear or of the ring magnet.

One type of rotation detector can compare a sinusoidal sensing element signal to a threshold. In some types of rotation detectors, a peak-to-peak percentage detector (or threshold detector) generates at least one threshold level that is equal to a percentage of the peak-to-peak magnetic field signal detected by one or more magnetic field sensing elements. For this type of rotation detector, the output signal changes state when the magnetic field signal crosses the at least one threshold level. One such threshold detector is described in U.S. Pat. No. 5,917,320 entitled "Detection of Passing Magnetic Articles While Periodically Adapting Detection Threshold" assigned to the assignee of the present disclosure and incorporated herein by reference.

In another type of rotation detector, a slope-activated detector, also referred to as a peak-referenced detector (or peak detector), threshold levels are identified that differ from the positive and negative peaks (i.e., the peaks and valleys) of the sensing element signal by a predetermined amount. Thus, in this type of rotation detector, the output signal changes state when the magnetic field signal departs from a peak and/or valley by the predetermined amount. One such peak detector is described in U.S. Pat. No. 6,091,239 entitled "Detection Of Passing Magnetic Articles With a Peak Referenced Threshold Detector," which is assigned to the assignee of the present disclosure and incorporated herein by reference. Another such peak detector is described in U.S. Pat. No. 6,693,419, entitled "Proximity Detector," which is assigned to the assignee of the present disclosure and incorporated herein by reference. Another such peak detector is described in U.S. Pat. No. 7,199,579, entitled "Proximity Detector," which is assigned to the assignee of the present disclosure and incorporated herein by reference.

It should be understood that, because the above-described peak-to-peak percentage detector (threshold detector) and the above-described peak-referenced detector (peak detector) both have circuitry that can identify the positive and negative peaks of a magnetic field signal, the peak-to-peak percentage detector and the peak-referenced detector both include a peak detector circuit configured to detect a positive peak and a negative peak of the magnetic field signal. Each, however, uses the detected peaks in different ways.

In order to accurately detect the positive and negative peaks of a magnetic field signal, some rotation detectors are capable of tracking at least part of the sensing element signal (magnetic field signal). To this end, typically, one or more digital-to-analog converters (DACs) can be used to generate a tracking signal, which tracks the magnetic field signal. For example, in the above-referenced U.S. Pat. Nos. 5,917,320 and 6,091,239, two DACs are used, one (PDAC) to detect the positive peaks of the magnetic field signal and the other (NDAC) to detect the negative peaks of the magnetic field signal.

As described above, an output signal generated by a conventional proximity detector used to detect a rotation of a ferromagnetic object (e.g., a ring magnet or a ferromagnetic gear) can have a format indicative of the rotation and of the speed of rotation of the ferromagnetic object or ring magnet. For example, the conventional proximity detector can generate the output signal as a two-state binary signal having a frequency indicative of the speed of rotation. In some arrangements, the output signal can be comprised of voltage or current pulses, a rate of which is representative of speed of rotation, and a pulse width of which is indicative of direction of rotation. This arrangement is described, for example, in U.S. Pat. No. 6,815,944, issued Nov. 9, 2004, assigned to the assignee of the present disclosure, and incorporated by reference herein in its entirety.

In conventional rotation detectors, the above-described pulses are generated at a rate that features on a ferromagnetic object pass by the proximity detector. A variety of types and shapes of ferromagnetic objects can be used.

In some arrangements, the ferromagnetic object is a gear-like object having gear teeth and the magnetic field sensor, e.g., rotation detector, is a back-biased magnetic field sensor, which includes a magnet to generate a magnetic field proximate to the magnetic field sensor. Gear teeth passing by the magnetic field sensor cause changes in the strength and angle of the magnetic field, and thus, the passing gear teeth can be sensed and the above-described pulses can be generated with a rate at which the gear teeth pass by.

In other arrangements, the ferromagnetic object is a ring magnet having one or more north-south pole pairs. These arrangements do not need the back-biased arrangement and the north-south pole pairs passing by the proximity detector can be sensed and the above-described pulses can be generated with a rate at which the north-south pole pairs pass by the magnetic field sensor.

SUMMARY

The present disclosure can provide a proximity detector (rotation detector) that provides a information regarding a moving or rotating ferromagnetic object. Some embodiments can provide angular information between pulses in the output signal of the conventional proximity detector (rotation detector). Some embodiments provide a fourth output level for the output signal that can be indicative of a failure state of the magnetic field sensor.

In accordance with an embodiment, a magnetic field sensor includes one or more magnetic field sensing elements operable to generate a respective one or more magnetic field signals proportional to a magnetic field associated with a ferromagnetic object capable of moving. The magnetic field sensor can also include one or more circuit channels coupled to receive the one or more magnetic field signals, the one or more circuit channels configured to generate a respective one or more channel signals. The magnetic field sensor can also include an electronic circuit coupled to the one or more channel signals and operable to generate a first output signal comprising a plurality of signal pulses having a plurality of state transitions, the plurality of signal pulses representative of at least a rate of movement of the ferromagnetic object, wherein the plurality of state transitions comprises at least one first state transition between a first level and a second level that is higher than the first level, at least one second state transition between the first level and a third level that is higher than the second level, and at least one third state transition to a fourth level that is lower than the first level, the second level, and the third level, wherein the fourth level is indicative of a failure state of the magnetic field sensor.

In accordance with another embodiment, a method used in a magnetic field sensor, includes generating, with one or more magnetic field sensing elements, a respective one or more magnetic field signals proportional to a magnetic field associated with a ferromagnetic object capable of moving. The method can further include generating one or more channel signals with a respective one or more circuit channels coupled to receive the one or more magnetic field signals. The method can further include generating, with an electronic circuit coupled to the one or more circuit channels, a first output signal comprising a plurality of signal pulses having a plurality of state transitions, the plurality of signal pulses representative of at least a rate of movement of the ferromagnetic object, wherein the plurality of state transitions comprises at least one first state transition between a first level and a second level that is higher than the first level, at least one second state transition between the first level and a third level that is higher than the second level, and at least one third state transition to a fourth level that is lower than the first level, the second level, and the third level, wherein the fourth level is indicative of a failure state of the magnetic field sensor.

In accordance with another embodiment, a magnetic field sensor includes means for generating, with one or more magnetic field sensing elements, a respective one or more magnetic field signals proportional to a magnetic field associated with a ferromagnetic object capable of moving. The magnetic field sensor can further include means for generating one or more channel signals with a respective one or more circuit channels coupled to receive the one or more magnetic field signals. The magnetic field sensor can further include means for generating, with an electronic circuit coupled to the one or more circuit channels, a first output signal comprising a plurality of signal pulses having a plurality of state transitions, the plurality of signal pulses representative of at least a rate of movement of the ferromagnetic object, wherein the plurality of plurality of state transitions comprises at least one first state transition between a first level and a second level that is higher than the first level, at least one second state transition between the first level and a third level that is higher than the second level, and at least one third state transition to a fourth level that is lower than the first level, the second level, and the third level, wherein the fourth level is indicative of a failure state of the magnetic field sensor.

DETAILED DESCRIPTION

Figure 1:
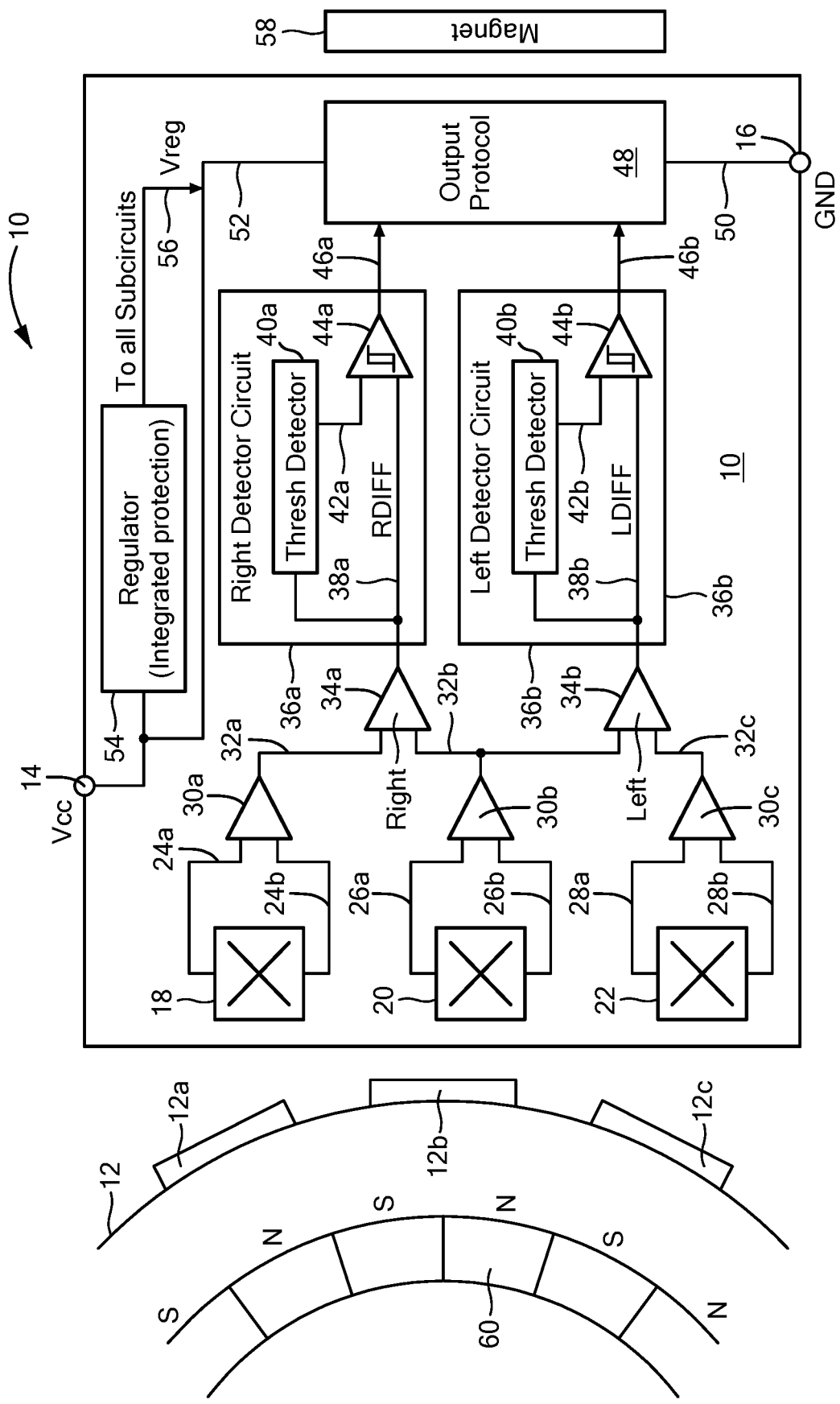
FIG. 1 is a block diagram of a magnetic field sensor for generating one or more magnetic field signals and for generating an output signal indicative of a speed and/or a direction of a rotation of a ferromagnetic object.

Before describing the present disclosure, some introductory concepts and terminology are explained. As used herein, the term "rotation detector" is used to describe a circuit that includes at least one "magnetic field sensing element," which detects a magnetic field. The rotation detector can sense movement, e.g., rotation, of a ferromagnetic object, for example, advance and retreat of magnetic domains of a ring magnet or advance and retreat of gear teeth of a ferromagnetic gear.

Similarly, the term "movement detector" can be used to describe either a rotation detector or used to describe a magnetic field sensor that can sense different movement, e.g., linear movement, of a ferromagnetic object, for example, linear movement of magnetic domains of a ring magnet or linear movement of gear teeth of a ferromagnetic gear.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses one or more magnetic field sensing elements, generally in combination with other circuits. The magnetic field sensor can be, for example, a rotation detector, a movement detector, a current sensor, or a proximity detector.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

As used herein, the term "baseline" and the phrase "baseline level" are used to describe a lowest magnitude (which may be near zero or may be some other magnetic field) of a magnetic field experienced by a magnetic field sensing element within a magnetic field sensor when the magnetic field sensor is operating in a system.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called "comparator" can be comprised of an analog comparator having a two state output signal indicative of an input signal being above or below a threshold level (or indicative of one input signal being above or below another input signal). However the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the terms "line" and "linear" are used to describe either a straight line or a curved line. The line can be described by a function having any order less than infinite.

Ferromagnetic objects described herein can have a variety of forms, including, but not limited to, a ring magnet having one or more pole pair, and a gear having two or more gear teeth.

Signals with pulses are described herein as generated by a magnetic field sensor. In some embodiments, the signals are provided on a communication link to an external processor, for example, a CPU within an automobile, to further process the pulses.

As used herein, the term "pulse" is used to describe a signal that begins at a first level or state, transitions rapidly to a second level or state different than the first level, and returns rapidly to the first level.

Two channel magnetic field sensors are described below having two circuit channels. In general, the two channel magnetic field sensors can be capable of detecting and communicating both movement speed (e.g., rotation speed) and also motion direction (e.g., rotation direction) of a ferromagnetic object. However, it should be appreciated that a single channel magnetic field sensor can be capable of detecting and communicating movement speed (e.g., rotation speed).

Ferromagnetic gears are used in some examples below to show a rotating ferromagnetic object having ferromagnetic features, i.e., teeth. However, in other embodiments, the gear can be replaced with a ring magnet having at least one pole pair. Also, linear arrangements of ferromagnetic objects are possible that move linearly.

Referring to FIG. 1, an exemplary rotation detector 10 having two channels can be used, for example, to detect passing gear teeth, for example, gear teeth 12a-12c of a ferromagnetic gear 12. A permanent magnet 58 can be placed at a variety of positions proximate to the gear 12, resulting in fluctuations of a magnetic field proximate to the gear 12 as the gear 12 having the gear teeth 12a-12c rotates. Use of the above-described magnet results in a so-called "back-bias" arrangement.

In other embodiments, the magnet 58 and the gear 12 can be omitted. Instead, the rotation detector 10 can be used to detect a rotation of a ring magnet 60 having at least one north pole and at least one south pole.

The rotation detector 10 can have a first terminal 14 coupled to a power supply denoted as Vcc. The rotation detector 10 can also have a second terminal 16 coupled to a fixed voltage source, for example, a ground voltage source, denoted as GND. Thus, is some arrangements, the rotation detector 10 is a two terminal device (or two wire device), for which an output signal appears as a signal current at the first terminal 14, superimposed upon the power supply voltage, Vcc. However, in other arrangements, one of ordinary skill in the art will understand that a rotation detector similar to the rotation detector 10 can be a three terminal device (three wire device) that has a third terminal (not shown) at which an output signal can appear as a voltage rather than a current.

The rotation detector 10 can include first, second, and third magnetic field sensing elements 18, 20, 22, respectively, here shown to be Hall effect elements. The first Hall effect element 18 generates a first differential voltage signal 24a, 24b, the second Hall effect element 20 generates a second differential voltage signal 26a, 26b, and the third Hall effect element 22 generates a third differential voltage signal 28a, 28b, each having respective AC signal components in response to the rotating gear 12.

While each one of the Hall effect elements 18, 20, 22 is shown to be a two terminal device, one of ordinary skill in the art will understand that each one of the Hall effect elements 18, 20, 22 is actually a four terminal device and the other two terminals of the Hall effect elements can be coupled to receive and pass respective currents as might be provided, for example, by a current source or by a voltage source (not shown).

The first differential voltage signal 24a, 24b can be received by a first differential preamplifier 30a, the second differential voltage signal 26a, 26b can be received by a second differential preamplifier 30b, and the third differential voltage signal 28a, 28b can be received by a third differential preamplifier 30c.

First and second amplified signals 32a, 32b generated by the first and second differential preamplifiers 30a, 30b, respectively, are received by a "right" channel amplifier 34a and the second amplified signal 32b and a third amplified signal 32c generated by the second and third differential preamplifiers 30b, 30c, respectively, are received by a "left" channel amplifier 34b. Designations of "right" and "left" are arbitrary.

A signal 38a generated by the right channel amplifier 34a is received by a right channel detector circuit 36a and a signal 38b generated by the left channel amplifier 34b is received by a left channel detector circuit 36b. The signals 38a, 38b can be analog signals, generally sinusoidal in nature.

Taking the right channel detector circuit 36a as representative of both of the detector circuits 36a, 36b, the right channel detector circuit 36a includes a threshold detector circuit 40a coupled to receive the signal 38a. The threshold detector circuit 40a is configured to detect positive and negative peaks of the signal 38a, to identify a peak-to-peak value of the signal 38a, and to generate the threshold signal 42a that, for example, takes on a first threshold at forty percent of the peak-to-peak value of the signal 38a and a second threshold value at sixty percent of the peak-to-peak value of the signal 38a. A comparator 44a is coupled to receive the threshold signal 42a and is also coupled to receive the signal 38a. As a result, the comparator 44a generates a binary, two-state, signal 46a that has transitions when the signal 38a crosses both the first and second thresholds.

A signal 46b generated by the left channel detector circuit 36b is generated in the same way as the signal 46a. However, since the magnetic field sensing elements 18, 20 contribute to the signal 46a, while the magnetic field sensing elements 20, 22 contribute to the signal 46b, it should be appreciated that the signals 46a, 46b have edges that differ in time (which is equivalent to phase for a particular signal frequency, i.e., particular rotation speed).

Furthermore, it should be appreciated that a direction of rotation of the gear 12 may be determined from a relative phase or relative time difference (e.g., lag or lead) of a particular edge transition in the signal 46a compared with a particular corresponding edge transition in the signal 46b. Therefore, a relative lag or a lead of edges of the signals 46a, 46b can be used to identify a direction of rotation of the gear 12.

The rotation detector 10 can include an output protocol module 48 coupled to receive and process the signals 46a, 46b and configured to generate an output signal 52, for example, as a current signal, which is indicative of the speed of rotation and the direction of rotation of the gear 12.

Movement speed of the gear 12 can be detected by the output protocol module 48 in accordance with a frequency of the signals 38a, 38b or 46a, 46b. Direction of movement of the gear 12 can be detected in accordance with a relative phase (i.e., sign of a phase) between the signals 38a, 38b or 46a, 46b.

While the rotation detector 10 is shown to include the two detector circuits 36a, 36b, each having a particular topology, it should be understood that any form of peak-referenced detectors (peak detectors) or peak-to-peak percentage detectors (threshold detectors), including, but not limited to, the above-described peak detectors and threshold percentage detectors, can be used in place of or in addition to the detector circuits 36a, 36b.

The output protocol module 48 can be operable to generate output signal formats described in conjunction with figures below.

In some embodiments, the right and left detector circuits 36a, 36b are omitted and the signals 38a, 38b are converted to digital signals and communicated directly to the output protocol module 48.

Figure 1A:
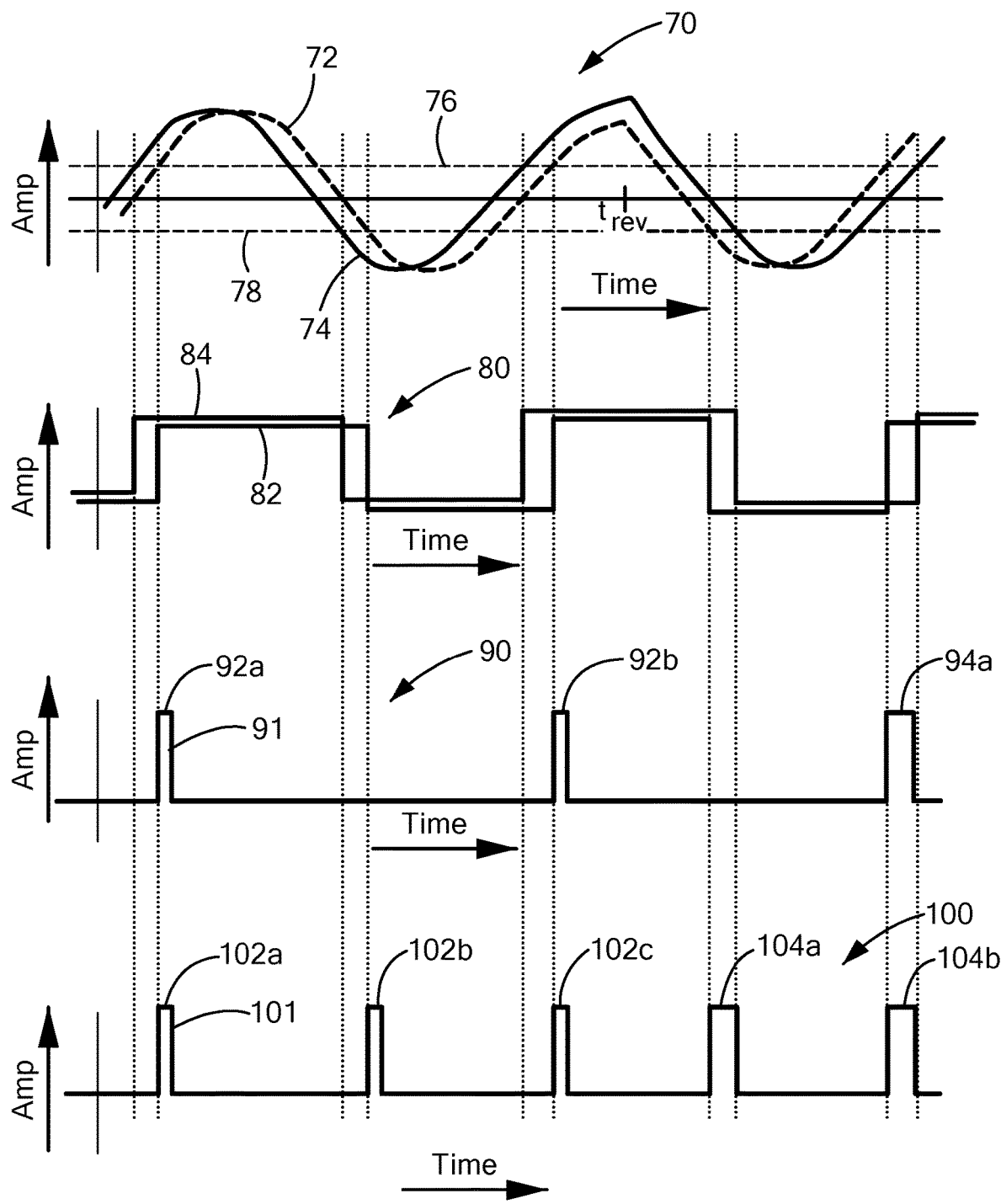
FIG. 1A is a set of graphs showing magnetic field signals, intermediate signals, and speed pulses, which can be output signals from the magnetic field sensor of FIG. 1.

Referring now to FIG. 1A, graphs 70, 80, 90, 100 have the same horizontal axes with scales in units of time in arbitrary units and vertical axes with scales in units of amplitude in arbitrary units. In the graph 70, signals 72, 74 are indicative of signals 38b, 38c of FIG. 1. Threshold 76 is indicative, for example, of sixty percent of a peak-to-peak value of either one of the signals 72, 74, and threshold 78 is indicative, for example, of forty percent of a peak-to-peak value of either one of the signals 72, 74.

The thresholds 76, 78 can be generated, for example, by one of (or both of) the threshold detectors 40a, 40b. Two thresholds 76, 78 are shown for clarity. However, in some embodiments, each one of the threshold detectors 40a, 40b can generate two respective thresholds, in which case, there can be four thresholds, two thresholds applied to one of the signals 38a and the other two applied to the other signal 38b of FIG. 1.

Shapes of the signals 72, 74 indicate a change of rotation direction of the gear 12 of FIG. 1 at a time trey. Before the time trey, the signal 74 leads the signal 72 in phase. After the time trey, the signal 72 leads the signal 74 in phase.

In the graph 80, signals 82, 84 are examples of signals 46a, 46b of FIG. 1. The signals 82, 84 can be two state signals having transitions with the signals 72, 74 cross thresholds 76, 78. Before the time trey, the signal 84 leads the signal 82 in phase. After the time trey, the signal 82 leads the signal 44 in phase. Thus, a sign of relative phase of the two signals 82, 84, can be used, for example, by the output protocol module 48 of FIG. 1, to identify the direction of rotation of the ferromagnetic gear 12 (or ring magnet 60) of FIG. 1.

In other embodiments, for example, an embodiment like the magnetic field sensor 10 of FIG. 1 but with only one magnetic field sensing element and one circuit channel instead of two, there can be only one sinusoidal signal, e.g., 72, and only one two-state signal, e.g., 82. In this case, there may be no provision to identify direction of rotation of the ferromagnetic gear 12 (or ring magnet 60).

In the graph 90, a signal 91 can be comprised of pulses 92a, 92b, and 94a, an example of a serial signal that can be the same as or similar to the signal 52 of FIG. 1. In time, the pulses 92a, 92b, and 94a can occur proximate to a time of positive or negative transitions of one of the signals 82a, 84b. Thus, the pulses 92a, 92b, 94a occur at each full cycle of the signals 72, 74.

A rate of the pulses 92a, 92b, and 94a can be indicative of a speed of rotation of the ferromagnetic object 12 (or ring magnet 60). Time periods, e.g., respective pulse widths, of the pulses 92a, 92b, and 94a can be indicative of a direction of rotation of the ferromagnetic gear (or ring magnet 60). Thus, before the time trey, the pulses 92a, 92b can be shorter, e.g., forty-five microseconds, and after the time trey, the pulses 94a can be longer, e.g., ninety microseconds.

As used herein, the pulses 92a, 92b, 94a are referred to as "speed pulses" because a rate of the pulse 92a, 92b, 94a is indicative of at least the speed of rotation (with or without direction information) of the ferromagnetic object 12 (or ring gear 60) of FIG. 1.

In the graph 100, a signal 101 can be comprised of pulses 102a, 102b, 102c, 104a, and 104b, an example of a serial signal that can be the same as or similar to the signal 52 of FIG. 1. In time, the pulses 102a, 102b, 102c, 104a, and 104b can occur proximate to a time of both positive and negative transitions of one of the signals 82a, 84b. Thus, the pulses 102a, 102b, 102c, 104a, and 104b at each half cycle of the signals 72, 74.

A rate of the pulses 102a, 102b, 102c, 104a, and 104b can be indicative of the speed of rotation of the ferromagnetic object 12 (or ring magnet 60). A time period, e.g., respective pulse widths, of the pulses 102a, 102b, 102c, 104a, and 104b can be indicative of a direction of rotation of the ferromagnetic gear (or ring magnet 60). Thus, before the time trey, the pulses 102a, 102b, 102c can be shorter, e.g., forty-five microseconds, and after the time trey, the pulses 104a, 104b can be longer, e.g., ninety microseconds.

It should be apparent that a rate of the pulses 102a, 102b, 102c, 104a, 104b is twice the rate of the pulses 92a, 92b, 94a.

Embodiments are shown below for which speed pulses are like the speed pulses 92a, 92b, 94b, where one speed pulse occurs on each cycle of the signals 72, 74. However, in other embodiments, like the speed pulses 102a, 102b, 102c, 104a, 104b, two speed pulses can occur in each cycle of the signals 72, 74.

Figure 2:
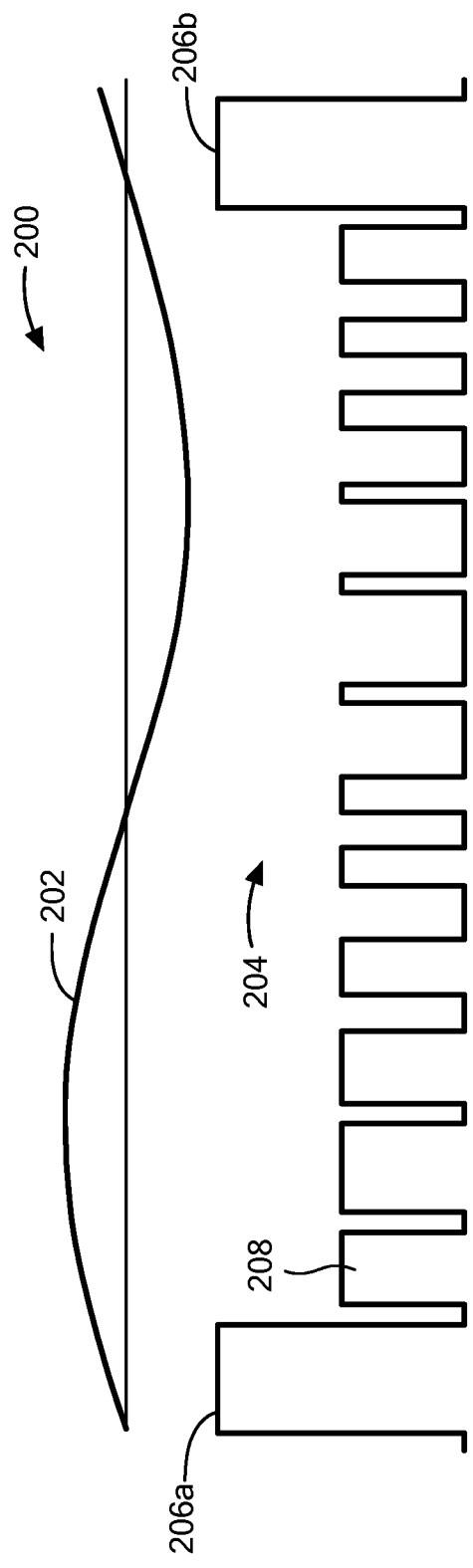
FIG. 2 is a graph showing a magnetic field signal and an example of a corresponding output signal indicative of a speed and/or a direction of a rotation of a ferromagnetic object.

Referring now to FIG. 2, a graph 200 has horizontal dimensions in units of time in arbitrary units and vertical dimensions in units of amplitude in arbitrary units. A signal 202 can be the same as or similar to one of the signals 38a, 38b of FIG. 1 and one of signals 72, 74 of FIG. 1A, but without a direction change. The signal 202 is generated in accordance with one or more magnetic field sensing elements (e.g., 18, 22 of FIG. 1) in response to a moving ferromagnetic object (e.g., 12 or 60 of FIG. 1).

A signal 204 is comprised of pulses. Tallest pulses 206a, 206b (the above-described speed pulses) are indicative of pulses generated by a magnetic field sensor, i.e., by the output protocol module 48 of FIG. 1. Each one of the tallest pulses can be indicative of a passing feature (e.g., a gear tooth 12a) on a ferromagnetic object 12. Thus, a rate of the speed pulses 206a, 206b can be indicative of a speed of movement (e.g., a speed of rotation) of the ferromagnetic object 12 or 60.

Further, in some arrangements, as described above in conjunction with graphs 90 and 100 of FIG. 1A, a pulse width of the speed pulses 206a, 206b can be indicative of a direction of movement (e.g., rotation) of the ferromagnetic target object. U.S. Pat. No. 6,815,944, issued Nov. 9, 2004, assigned to the assignee of the present disclosure, and incorporated by reference herein in its entirety, describes pulse width direction encoding. Thus, it will be understood that when referring to speed pulses herein, the same pulses can communicate direction of movement by way of pulse widths.

The height of the speed pulses 206a, 206b can be indicative of a particular predetermined magnitude of current, for example, in a two terminal (i.e., two wire) magnetic field sensor with an associated two wire communication scheme described above in conjunction with FIG. 1. In other arrangements, the height of the speed pulses 206a, 206b can be indicative of a particular predetermined magnitude of voltage, for example, in a three terminal (i.e. three wire) magnetic field sensor with an associated three wire communication scheme also described above in conjunction with FIG. 1.

High resolution pulses 208 between the speed pulses 206a, 206b can have pulse widths indicative of pulse width modulation (PWM) in accordance with values of the signal 202. In some embodiments, the PWM sweeps in accordance with an instantaneous value of the sinusoid 202. Here, high resolution pulses 208 are shortest as the signal 202 achieves a minimum value and pulses are longest as the signal 202 achieves a maximum value. In other embodiments, the opposite can be generated.

While the speed pulses 206a, 206b are shown to be larger in amplitude than the PWM high resolution pulses 208, in other embodiments, the speed pulses 206a, 206b have the same amplitude as the PWM high resolution pulses 208. The same also applies to FIGS. 3-9.

It should be apparent that the PWM high resolution pulses 208 can provide a higher resolution identification of a position of the moving, e.g., rotating, ferromagnetic object 12 than can the speed pulses 206a, 206b alone.

In some embodiments, there can be at least one, at least two, at least three, at least four, at least five, at least six, at least seven, at least eight, at least nine, at least ten, or more than ten PWM high resolution pulses 208 in each cycle of the signal 202, or alternately, in each half cycle of the signal 202.

Since each pulse includes two state transitions, there can be at least two, at least four, at least six, at least eight, at least ten, at least twelve, at least fourteen, at least sixteen, at least eighteen, at least twenty, or more than twenty PWM high resolution pulse transitions in each cycle of the signal 202, or alternately, in each half cycle of the signal 202.

Figure 3:
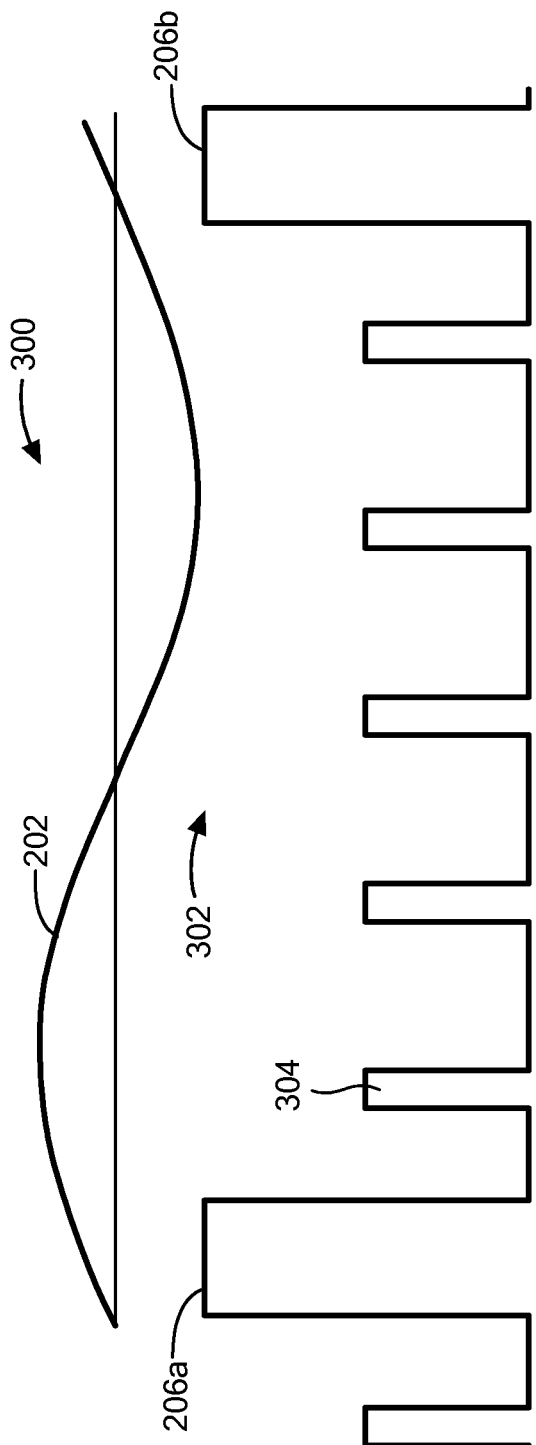
FIG. 3 is a graph showing a magnetic field signal and another example of a corresponding output signal indicative of a speed and/or a direction of a rotation of a ferromagnetic object.

Referring now to FIG. 3, in which like elements of FIG. 2 have the same reference designations, a signal 302 can include the speed pulses 206a, 206b and also a fixed number of high resolution pulses 304, for example, five pulses, each pulse with equal pulse width. The high resolution pulses 304 can be arranged to fill a time between the speed pulses 206a, 206b. Thus, the high resolution pulses 304 can compress together or expand apart relative to each other depending upon a rate of the speed pulses 206a, 206b. In some embodiments, the high resolution pulses 304 can be equally spaced in time. In other embodiments, the high resolution pulses 304 are not equally spaced in time, but are instead a fixed number of pulses.

In some embodiments, there can be at least one, at least two, at least three, at least four, at least five, at least six, at least seven, at least eight, at least nine, at least ten, or more than ten fixed number high resolution pulses 304 in each cycle of the signal 202, or alternately, in each half cycle of the signal 202.

Since each pulse includes two state transitions, there can be at least two, at least four, at least six, at least eight, at least ten, at least twelve, at least fourteen, at least sixteen, at least eighteen, at least twenty, or more than twenty high resolution pulse transitions in each cycle of the signal 202, or alternately, in each half cycle of the signal 202.

It should be apparent that the fixed number of pulses 304 can provide a higher resolution identification of a position of the moving, e.g., rotating, ferromagnetic object 12 than can the speed pulses 206a, 206b alone.

It is indicated by way of the signal 202 that the speed pulses 206a, 206b occur once per cycle of the signal 202. However, in other embodiments, like the graph 100 of FIG. 1A, there can be two speed pulses in each cycle of the signal 202 and the pulses 304 can be between the two speed pulses per cycle.

In some embodiments, the pulses 304 can have first pulse widths, e.g., forty-five microseconds when the ferromagnetic object 12 or 60 rotates in a first direction, and the pulses 304 can have a second different pulse width, e.g., ninety microseconds, when the ferromagnetic object 12 or 60 rotates in a second different direction. Thus, for some embodiments, the speed pulses 206a, 206b can be omitted.

Figure 4:
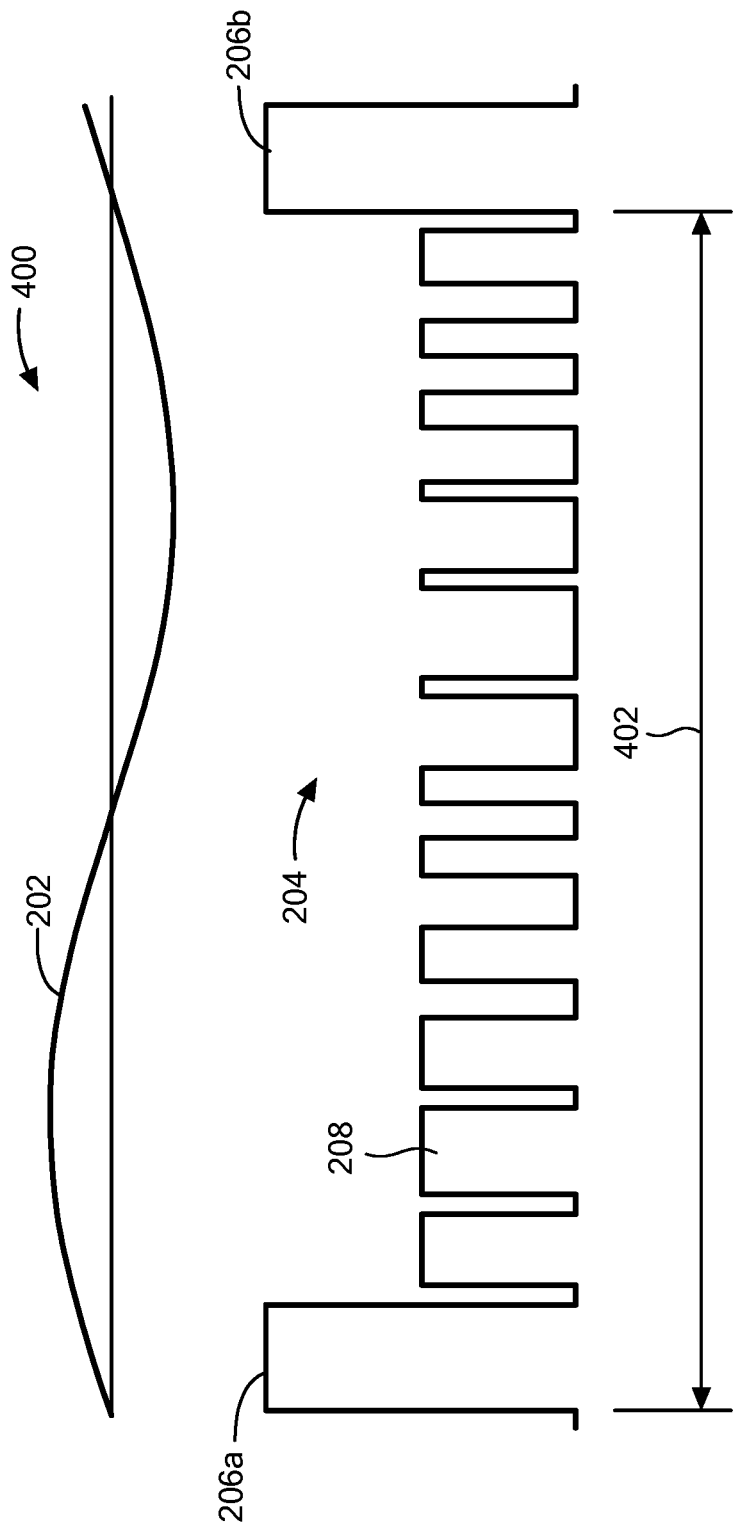
FIG. 4 is a graph showing a magnetic field signal and another example of a corresponding output signal indicative of a speed and/or a direction of a rotation of a ferromagnetic object.

Referring now to FIG. 4, in which like elements of FIG. 2 have the same reference designations, signals 202 and 204 of FIG. 2 are shown again. A time period 402 (i.e., a frequency of the speed pluses 206a, 206b) is indicative of a speed of rotation of ferromagnetic object 12.

Figure 5:
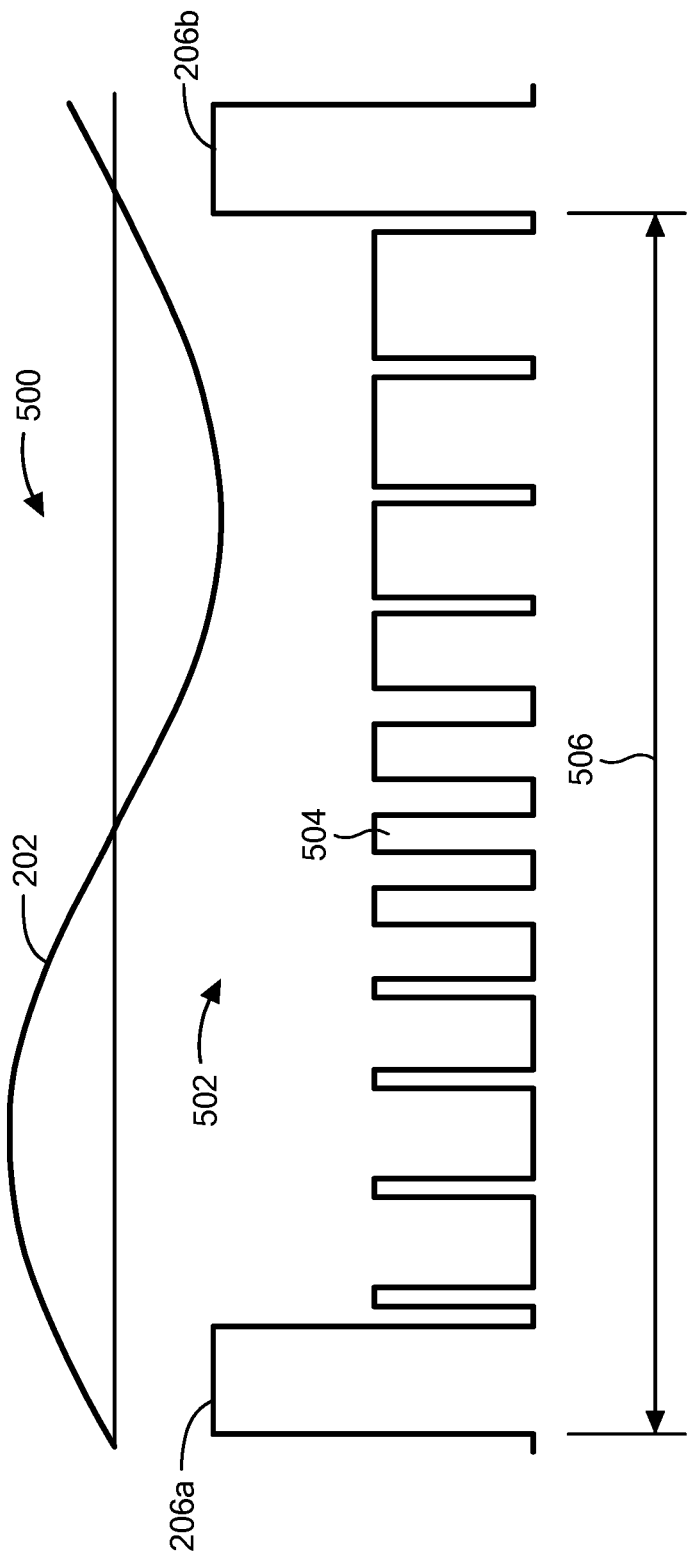
FIG. 5 is a graph showing a magnetic field signal and another example of a corresponding output signal indicative of a speed and/or a direction of a rotation of a ferromagnetic object.

Referring now to FIG. 5, in which like elements of FIG. 2 have the same reference designations, a signal 502 has pulses, including the speed pulses 206a, 206b described above in conjunction with FIG. 2 and including PWM high resolution pulses 504.

The PWM high resolution pulses 504 between the speed pulses 206a, 206b can have pulse widths indicative of pulse width modulation (PWM) in accordance with a linear sweep of pulse width between the speed pulses 206a, 206b.

It is shown that the pulse width sweep of the PWM high resolution pulses 504 sweeps in a direction, lowest pulse width to highest pulse width left to right. In other embodiments, the opposite direction PWM sweep can be generated.

It should be apparent that the PWM high resolution pulses 504 can provide a higher resolution identification of a position of the moving, e.g., rotating, ferromagnetic object 12 than can the speed pulses 206a, 206b alone.

It is indicated by way of the signal 202 that the speed pulses 206a, 206b can occur once per cycle of the signal 202. However, in other embodiments, like the graph 100 of FIG. 1A, there can be two speed pulses in each cycle of the signal 202 and the PWM high resolution pulses 504 can be between the two speed pulses per cycle.

In some embodiments, there can be at least one, at least two, at least three, at least four, at least five, at least six, at least seven, at least eight, at least nine, at least ten, or more than ten PWM high resolution pulses 504 in each cycle of the signal 202, or alternately, in each half cycle of the signal 202.

Since each pulse includes two state transitions, there can be at least two, at least four, at least six, at least eight, at least ten, at least twelve, at least fourteen, at least sixteen, at least eighteen, at least twenty, or more than twenty PWM high resolution pulse transitions in each cycle of the signal 202, or alternately, in each half cycle of the signal 202.

As described above in conjunction with FIG. 1A, pulse widths of the speed pulses 206*a*, 206*b* can be used to encode direction of movement of the ferromagnetic object. However, it should also be apparent than the direction of rotation can otherwise or also be encoded as a direction of the pulse width sweep (low frequency to high frequency or vice versa) in the PWM signal between the speed pulses 206*a*, 206*b*, with or without the encoding of the pulse widths of the speed pulses 206*a*, 206*b*. Thus, in some embodiments, the speed pulses 206*a*, 206*b* can be omitted.

Figure 6:
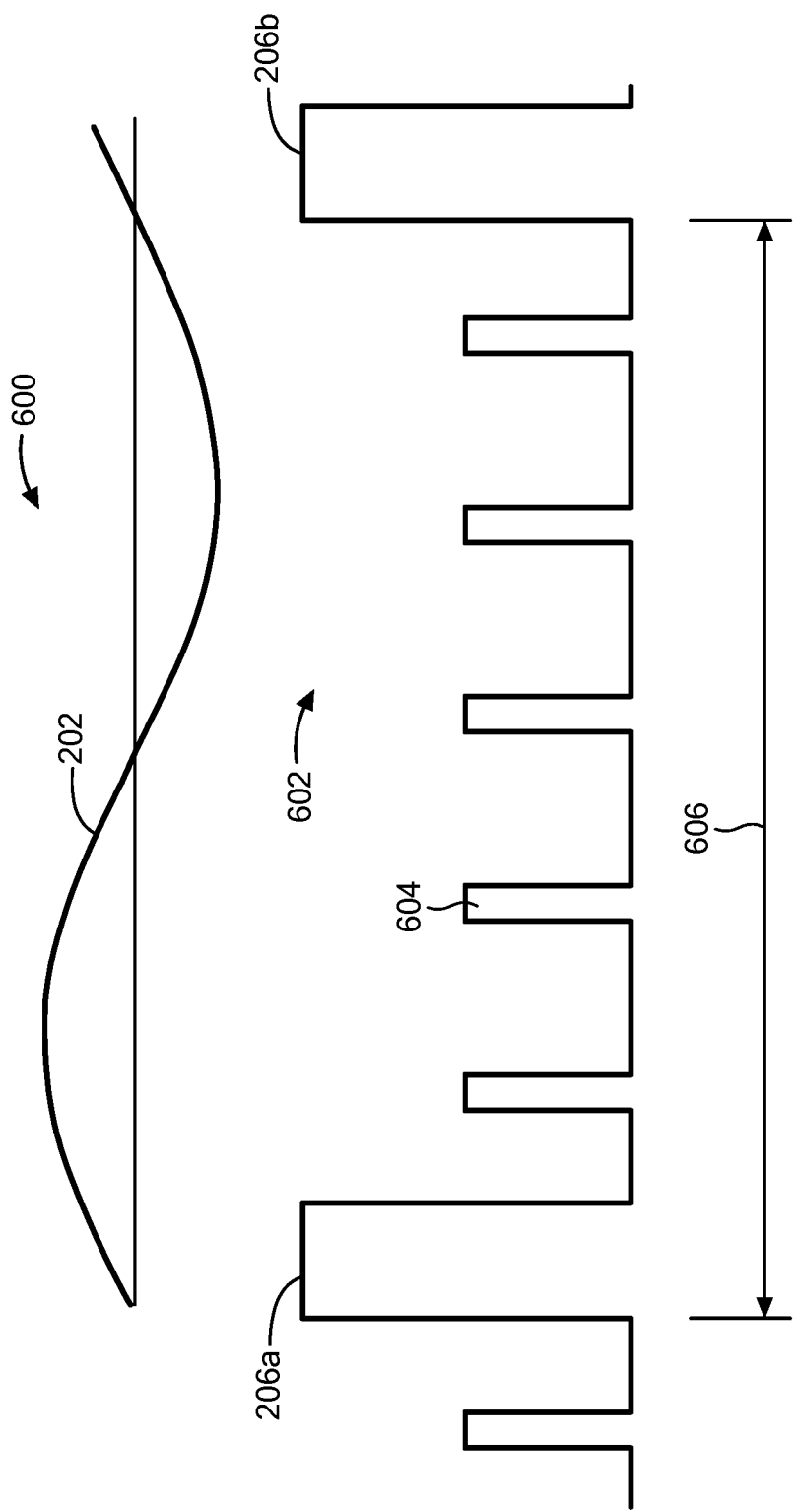
FIG. 6 is a graph showing a magnetic field signal and another example of a corresponding output signal indicative of a speed and/or a direction of a rotation of a ferromagnetic object.

Referring now to FIG. 6, in which like elements of FIG. 2 shown using like reference designations, a signal 602 can include the speed pulses 206*a*, 206*b* and equidistant high resolution pulses 604 between the speed pulses 206*a*, 206*b*, the high resolution pulses 604 with fixed separations, and with equal pulse width, also referred to herein as equidistant pulses. High resolution pulses 604 are similar to the pulses 304 of FIG. 3, however, the pulses 304 can be a fixed number of pulses regardless of fixed separation.

It should be apparent that the equidistant high resolution pulses 604 with the fixed time separation can provide a higher resolution identification of a position of the moving, e.g., rotating, ferromagnetic object than can the speed pulses 206*a*, 206*b* alone.

It is indicated by way of the signal 202 that the speed pulses 206*a*, 206*b* occur once per cycle of the signal 202. However, in other embodiments, like the graph 100 of FIG. 1A, there can be two speed pulses in each cycle of the signal 202 and the equidistant high resolution pulses 604 can be between the two speed pulses per cycle.

In some embodiments, the equidistant high resolution pulses 604 can have first pulse widths, e.g., forty-five microseconds when the ferromagnetic object 12 or 60 rotates in a first direction, and the equidistant high resolution pulses 604 can have a second different pulse width, e.g., ninety microseconds, when the ferromagnetic object 12 or 60 rotates in a second different direction. For these embodiments, the speed pulses 206*a*, 206*b* can be omitted.

In some embodiments, there can be at least one, at least two, at least three, at least four, at least five, at least six, at least seven, at least eight, at least nine, at least ten, or more than ten equidistant high resolution high resolution pulses 604 in each cycle of the signal 202, or alternately, in each half cycle of the signal 202.

Since each pulse includes two state transitions, there can be at least two, at least four, at least six, at least eight, at least ten, at least twelve, at least fourteen, at least sixteen, at least eighteen, at least twenty, or more than twenty equidistant high resolution pulse transitions in each cycle of the signal 202, or alternately, in each half cycle of the signal 202.

Figure 7:
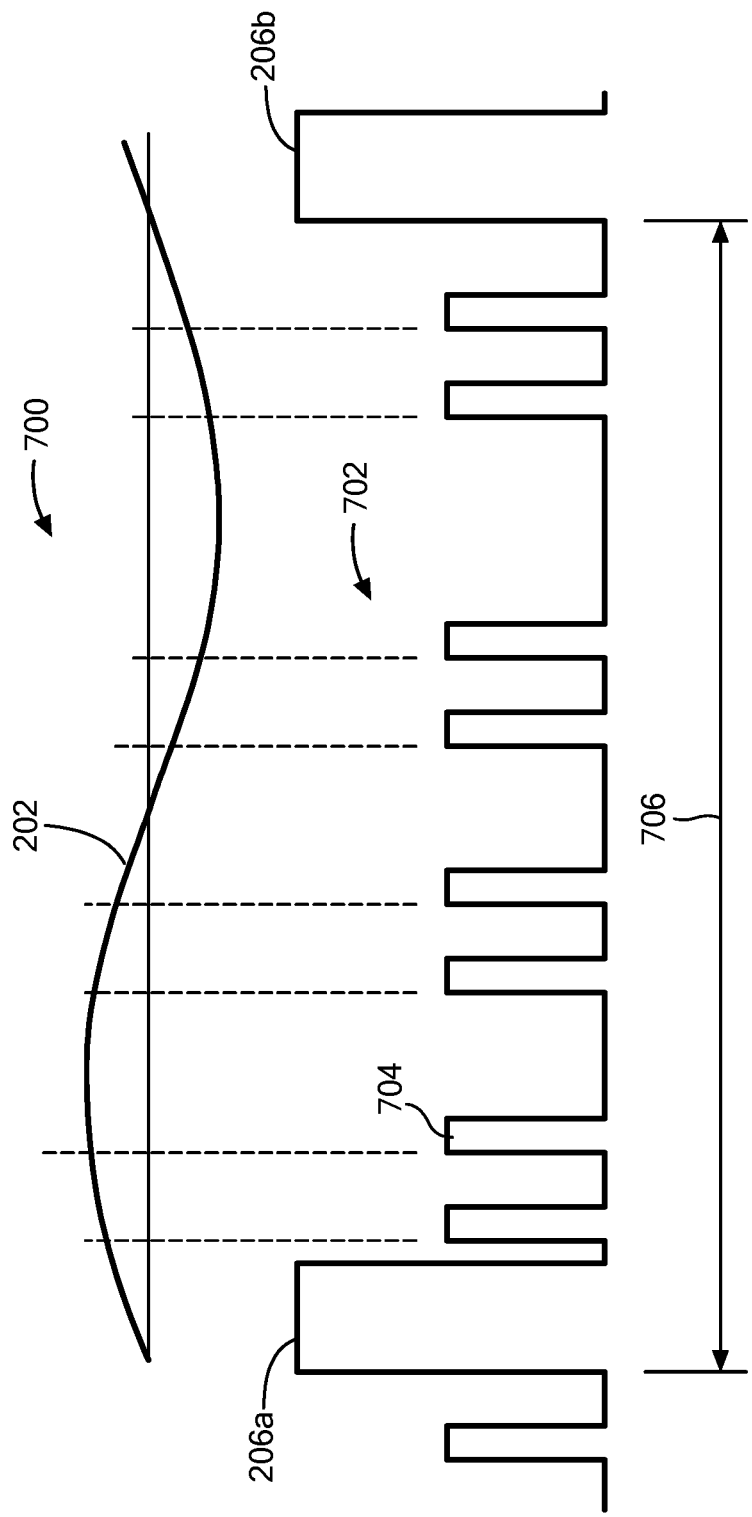
FIG. 7 is a graph showing a magnetic field signal and another example of a corresponding output signal indicative of a speed and/or a direction of a rotation of a ferromagnetic object.

Referring now to FIG. 7, in which like elements of FIG. 2 shown using like reference designations, a signal 702 can include the speed pulses 206*a*, 206*b* and threshold high resolution pulses 704 between the speed pulses 206*a*, 206*b*. The threshold high resolution pulses 704 can include one or more pulses (here one pulse) each time the sinusoid crosses a respective threshold, here eight thresholds represented by dashed lines.

While one pulse is shown at each respective threshold crossing of the sinusoid, it should be apparent that there can be one or more pulses at each threshold crossing. Also, there can be different numbers of pulses at the crossings for the thresholds where the sinusoid 202 is above a zero crossing and where the sinusoid 202 is below the zero crossing.

It should be apparent that the threshold high resolution pulses 704 can provide a higher resolution identification of a position of the moving, e.g., rotating, ferromagnetic object than can the speed pulses alone.

It is indicated by way of the signal 202 that the speed pulses 206*a*, 206*b* occur once per cycle of the signal 202. However, in other embodiments, like the graph 100 of FIG. 1A, there can be two speed pulses in each cycle of the signal 202 and the threshold high resolution pulses 704 can be between the two speed pulses per cycle.

In some embodiments, the threshold high resolution pulses 704 can have first pulse widths, e.g., forty-five microseconds when the ferromagnetic object 12 or 60 rotates in a first direction, and the threshold high resolution pulses 704 can have a second different pulse width, e.g., ninety microseconds, when the ferromagnetic object 12 or 60 rotates in a second different direction. For these embodiments, the speed pulses 206*a*, 206*b* can be omitted.

In some embodiments, associated with a number of thresholds, there can be at least one, at least two, at least three, at least four, at least five, at least six, at least seven, at least eight, at least nine, at least ten, or more than ten threshold high resolution high resolution pulses 704 in each cycle of the signal 202, or alternately, in each half cycle of the signal 202.

Since each pulse includes two state transitions, there can be at least two, at least four, at least six, at least eight, at least ten, at least twelve, at least fourteen, at least sixteen, at least eighteen, at least twenty, or more than twenty threshold high resolution pulse transitions in each cycle of the signal 202, or alternately, in each half cycle of the signal 202.

Figure 8:
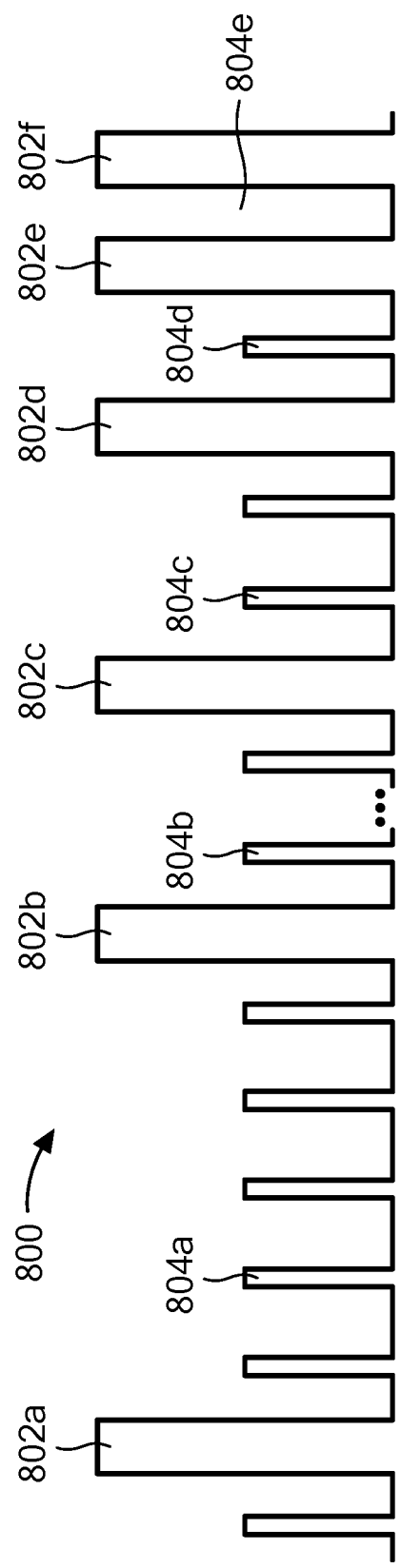
FIG. 8 is a graph showing another example of a corresponding output signal indicative of a speed and/or a direction of a rotation of a ferromagnetic object.

Referring now to FIG. 8, it should be understood that, referring also to FIGS. 3 and 6 above, as the moving ferromagnetic object moves (e.g., rotates) more quickly, the speed pulses 802*a*, 802*b*, 802*c*, 802*d*, 802*e*, 802*f* move closer together in time. Thus, at very high speeds, the high resolution pulses 804*a*, 804*b*, 804*c*, 804*d* can degenerate and eventually disappear (e.g., no pulse 804*e*) at high movement speeds. In FIG. 8, it is shown that the fixed separation high resolution pulses 604 of FIG. 6 or the fixed number of high resolution pulses 304 of FIG. 3 can decrease in number of pulses at higher movement speeds. However, any of the above formats can degrade and disappear at higher movement speeds of the ferromagnetic object. Circuits described below can provide, in some embodiments, a speed detection module to provide this function.

It should be recognized that the speed pulses 802*a*, 802*b*, 802*c*, 802*d*, 802*e*, 802*f*, being closer together at higher movement speeds of the ferromagnetic object, can provide higher resolution of the positions of the ferromagnetic object without the additional high-resolution pulses.

Figure 9:
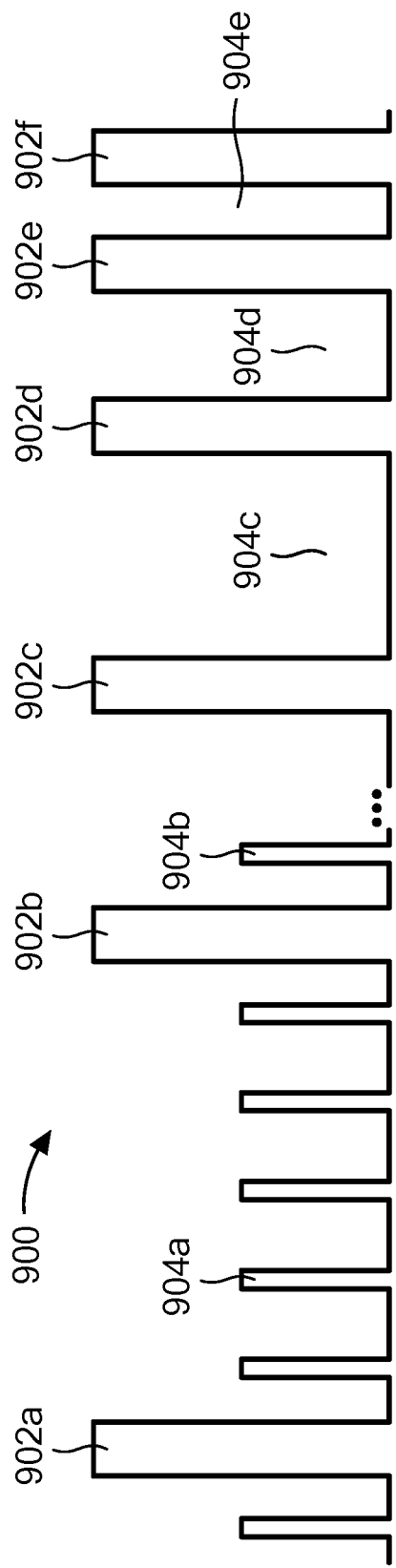
FIG. 9 is a graph showing another example of a corresponding output signal indicative of a speed and/or a direction of a rotation of a ferromagnetic object.

Referring now to FIG. 9, above some predetermined rotation speed, the high-resolution pulses 904*a*, 904*b* of any type are not generated at all (no pulses 904*c*, 904*d*, 904*e*). Circuits described below can provide, in some embodiments, a speed detection module to provide this function.

As will be appreciated in light of the present disclosure, magnetic field sensor integrated circuits can have two physical pins (not shown) coupled to two physical wires (not shown) to provide a two-wire arrangement in which power is supplied to the magnetic field sensor as a voltage on a first wire and the output signal is a current signal on the same first wire. A second wire can provide a return current. In these arrangements, the magnetic field sensor can have one or more magnetic field sensing elements. Embodiments having one magnetic field sensing element can provide speed information but not direction. Embodiments having two or more magnetic field sensing elements can provide speed and direction information. This arrangement can communicate any of the above signal formats, and also formats below, using two wires.

In some embodiments, magnetic field sensor integrated circuits can have three physical pins (not shown) coupled to three physical wires (not shown) to provide a three-wire arrangement in which power is supplied to the magnetic field sensor as a voltage on a first wire, ground is coupled to a second wire, and the output signal is a voltage or current signal on a third wire. In these arrangements, the magnetic field sensor can have one or more magnetic field sensing elements. Embodiments, having one magnetic field sensing element can provide speed information but not direction. Embodiments having two or more magnetic field sensing elements can provide speed and direction information. This arrangement can communicate any of the above signal formats, and also formats below, using three wires.

Examples of magnetic field sensors can include a variety of different arrangements of magnetic field sensing elements. Magnetic field sensors can include three planar Hall elements. In other embodiments, the magnetic field sensor can comprise two magnetoresistance elements arranged as two bridges with fixed resistors, two magnetoresistance elements arranged as two bridges with fixed resistors and physically arranged at ninety degrees to each other, or two vertical Hall elements physically arranged at ninety degrees to each other. Other arrangements of magnetic field sensing elements are also possible.

Figure 10:
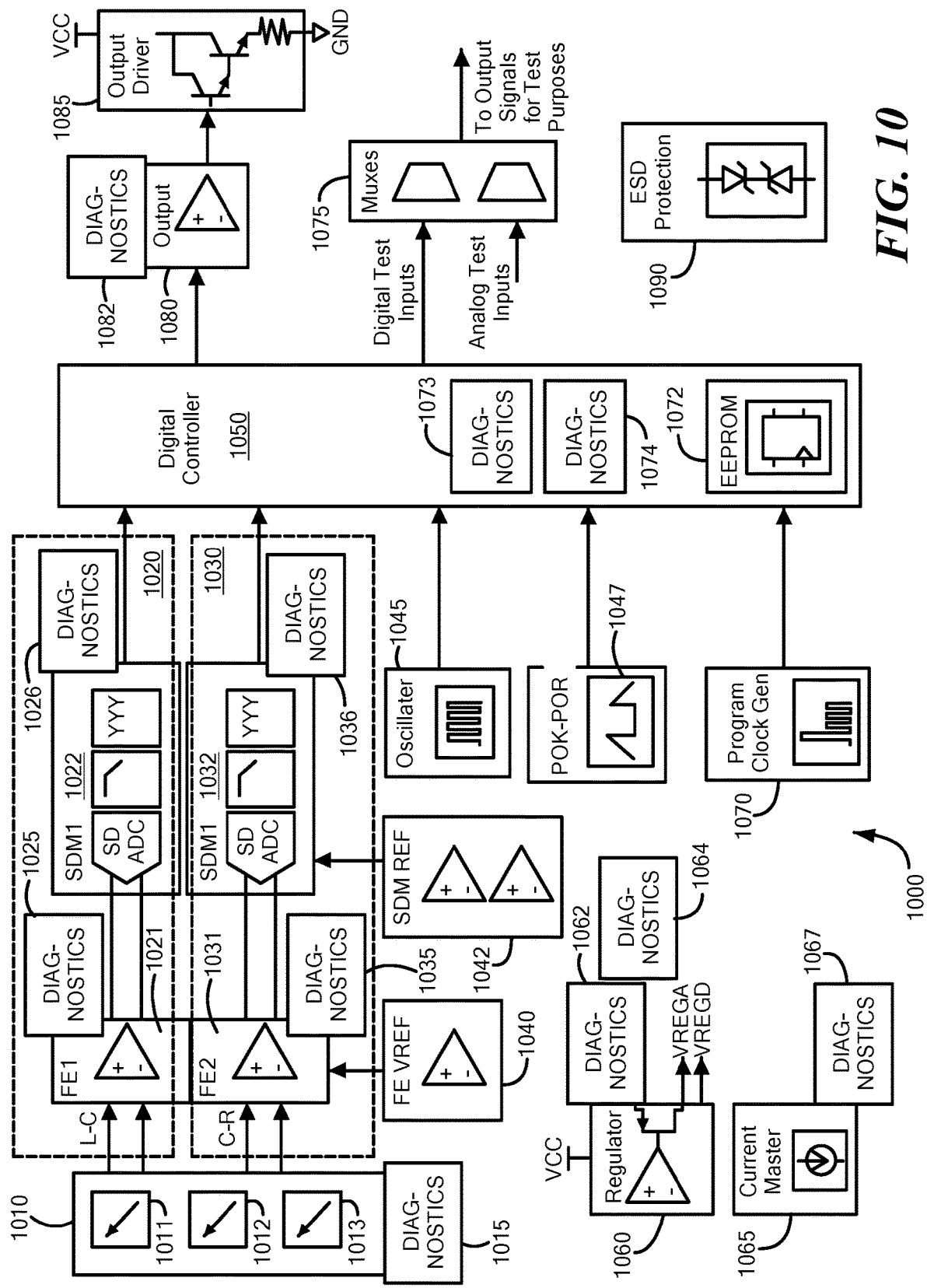
FIG. 10 is a block diagram of a magnetic field sensor for generating one or more magnetic field signals and for generating an output signal indicative of a speed and/or a direction of rotation of a ferromagnetic object and including a plurality of diagnostic circuits to detect a failure state of the magnetic field sensor.

FIG. 10 is a block diagram of a magnetic field sensor 1000 for generating one or more magnetic field signals and for generating an output signal indicative of a speed and/or a direction of rotation of a ferromagnetic object and including a plurality of diagnostic circuits to detect a failure or fault of the magnetic field sensor. It will be appreciated that FIG. 10 illustrates a partially digital implementation of a magnetic field sensor and thus includes a digital controller 1050.

The sensor 1000 includes one or more magnetic field sensing elements 1011, 1012, and 1013, referred to collectively as sensing elements 1010. For example, elements 1011, 1012, and 1013 can correspond to, and be the same as or substantially similar to, elements 18, 20, and 22, respectively, of FIG. 1. The magnetic field sensing elements 1011, 1012, and 1013 can be arranged and coupled to generate differential voltage signals that can be the same as or similar to signals 38a, 38b of FIG. 1.

The sensor 1000 includes a first "left" circuit channel 1020 and a second "right" circuit channel 1030 each coupled to receive one or more differential voltage signals produced by the magnetic field sensing elements 1011, 1012, 1013 and generate one or more channel signals. The left circuit channel 1020 can include a front-end amplifier 1021 and analog processing circuitry 1022. Likewise, the right circuit channel 1030 can include a front-end amplifier 1031 and analog processing circuitry 1032. Analog processing circuitry 1022, 1032 can each include signal processing elements such as a sigma-delta analog-to-digital converter (ADC) and a filter such as a low-pass filter.

The sensor 1000 includes an oscillator 1045 and a POK-POR 1047. The POK-POR module 1047 is for monitoring the power level of the circuit, where POR is power-on reset and POK is the power-OK.

The sensor 1000 includes a voltage regulator 1060 that receives voltage from a power source Vcc and maintains the voltage within an acceptable operating range. The voltage regulator can output a regulated voltage for powering analog circuitry of the sensor (VREGA) and/or a regulated voltage for powering digital circuitry of the sensor (VREGD). The sensor 1000 also includes a bias current source 1065 and a clock generation element 1070 coupled to the digital controller 1050.

Figure 11:
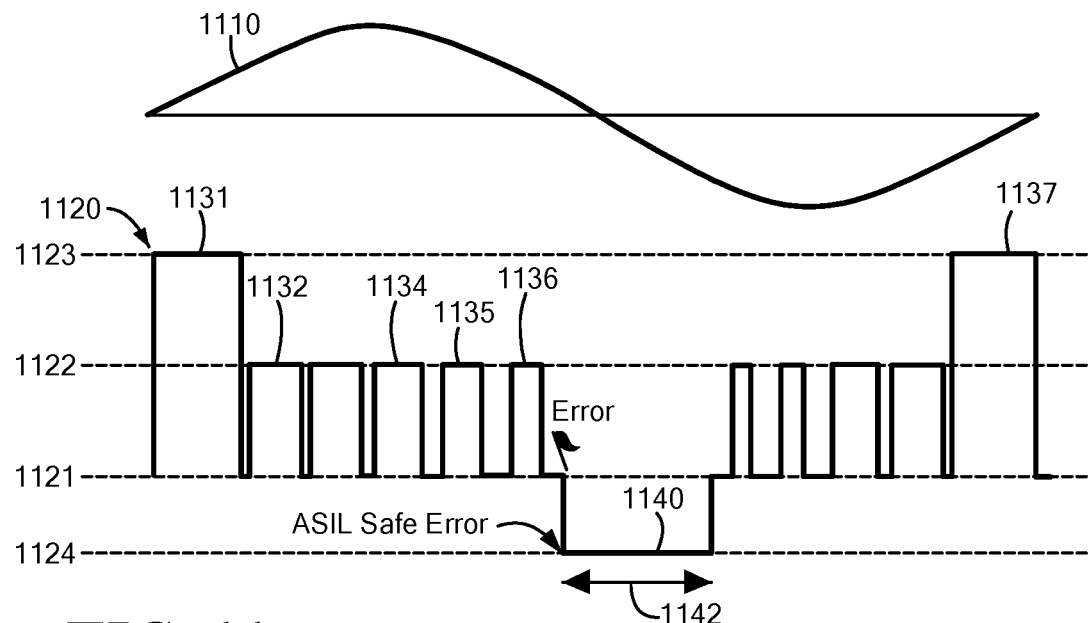
FIG. 11 is a graph showing a magnetic field signal and another example of a corresponding output signal indicative of a speed and/or a direction of a rotation of a ferromagnetic object and including a failure state output where the failure is recoverable.

Digital controller 1050 processes the channel signals from the right and left circuit channels 1020, 1030 to determine the speed and/or direction of movement, such as rotation of a proximate target. In this regard, controller 1050 may perform functions similar to, or the same as, right detector circuit 36a, left detector circuit 36b and optionally also output protocol module 48 of FIG. 1. Additionally, controller 1050 receives diagnostic signals from one or more of the diagnostic circuits coupled to various components of the magnetic field sensor 1000 and provides a fault indication or fault state at the sensor output signal. The fault indication at the sensor output signal can be provided at a fourth output level (see, for example, FIG. 11 showing the fourth output level 1124) or a fifth or any signal level other than the levels used to convey normal operating information (e.g., first level 1121, second level 1122, or third level 1123). The fault indication can provide a type of failure based on the duration of the output signal at the fourth output level (e.g., a first duration can indicate a first type of failure and a second duration can indicate a second type of failure). More particularly, after the fault indication is provided for a predetermined duration (which duration may correspond to a fault type such as a critical type of fault or warning type of fault), a recovery attempt occurs by the magnetic field sensor 1000 to attempt to recover from the failure. If recovery occurs, then the duration of the fault indication can be used to detect the type of fault as a failure of the first type or a failure of the second type (e.g., critical failure or warning failure).

The digital controller 1050 outputs one or more digital signals to the output protocol module 1080 and, in some embodiments, to multiplexers 1075 for test purposes. More particularly, controller 1050 determines the speed and/or direction of a proximate object based on the channel signals and combines this information with fault information when present to generate the sensor output signal in formats described further below. The output of module 1080 is fed to an output driver 1085 that provides the sensor output signal in various formats, such as the illustrates two-wire format in which the output signal is provided in the form of current pulses on the power connection to the sensor. The output protocol module 1080 can be the same or substantially similar as the output protocol module 48 of FIG. 1, for example. The sensor 1000 can further include electrostatic discharge (ESD) protection 1090.

The sensor 1000 further includes a plurality of diagnostic circuits coupled to various components of the sensor 1000 that detect and report a failure state of the one or more components of the sensor 1000. In embodiments, detected faults can include different categories of faults, such as those characterized as critical faults and those characterized as warning faults. The characterization of faults as being critical versus warning can be application specific, industry and/or user specified as examples. In some embodiments in accordance with an Automotive Safety Integrity Level (ASIL) Specification, critical faults are faults that are internal to the sensor due to a random defect and warning faults are faults that are internal to the sensor due to a random effect or magnetic stimulus beyond specification limits.

The diagnostic circuits of the sensor 1000 can include a magnetic field sensing element diagnostic circuit 1015, a left front-end amplifier diagnostic circuit 1025, a left filter saturation diagnostic circuit 1026, a right front-end amplifier diagnostic circuit 1035, a right filter saturation diagnostic circuit 1036, an analog voltage regulator diagnostic circuit 1062, a digital voltage regulator diagnostic circuit 1064, a bias current diagnostic circuit 1067, an over-frequency diagnostic circuit 1073, an output collision diagnostic circuit 1074, and an output current source diagnostic circuit 1082.

Each of the diagnostic circuits can be coupled to the digital controller 1050. The digital controller 1050 outputs a fourth output level that is indicative of a fault when a diagnostic circuit detects the appropriate failure conditions, as will be appreciated in light of the present disclosure. The diagnostic circuits can convey the occurrence of a fault or failure to the controller in various manners, such as by asserting a flag, or pulling the respective diagnostic signal to a predetermined level, state, or value as examples. The duration of the failure indication can be used to distinguish a warning failure from a critical failure when a recovery from the fault occurs.

Table 1 below shows various types of faults, the corresponding type as being a critical failure or a warning failure, and the contributor of the failure as being either an IC failure or an input signal issue. The diagnostic circuit reference number in FIG. 10 that corresponds to the fault mode is also shown in Table 1.

TABLE 1

Diagnostics Fault Modes

| Diagnostic Circuit | Fault Mode | Safe Status | Contributor |
|---|---|---|---|
| 1025 | Front End Left Channel Fault | Critical | IC failure |
| 1035 | Front End Right Channel Fault | Critical | IC failure |
| 1062 | Analog Voltage Regulator Fault | Critical | IC failure |
| 1064 | Digital Voltage Regulator Fault | Critical | IC failure |
| 1067 | Bias Current Fault | Critical | IC failure |
| 1015 | Hall Drive Fault | Critical | IC failure |
| 1082 | Output Fault (IMID) | Critical | IC failure |
| 1026 | Filter Saturation (left) | Critical | IC failure |
| 1036 | Filter Saturation (Right) | Critical | IC failure |
| 1073 | Over-frequency Diagnostic | Warning | Input signal |
| 1074 | Output Collision Diagnostic | Warning | Input signal |

The left front-end amplifier diagnostic circuit 1025 is coupled to the front-end amplifier 1021 and a right front-end amplifier diagnostic circuit 1035 is coupled to the front-end amplifier 1031. The left and right front-end amplifier diagnostic circuits 1025 and 1035 are each configured to monitor a voltage level associated with their respective front-end amplifiers to ensure that it is within a desired range of operation. When the voltage level associated with the respective front-end amplifier falls outside of the desired range of operation, the diagnostic circuit 1025, 1035 outputs a diagnostic signal indicative of a failure. The diagnostic signal is received by the controller 1050 which transitions the output signal to the fourth level indicative of the critical state.

The sensor 1000 includes a voltage regulator diagnostic circuit, which may be an analog voltage regulator diagnostic circuit 1062 or a digital voltage regulator diagnostic circuit 1064 coupled to the voltage regulator 1060. The analog or digital voltage regulator diagnostic circuits 1062, 1064 monitor an operating voltage of the voltage regulator 1060 to ensure that the operating voltage is at least above a predetermined threshold value. When the operating voltage is less than the predetermined threshold value, the voltage regulator diagnostic circuit 1062, 1064 outputs a diagnostic signal indicative of a failure. The diagnostic signal is received by the controller 1050 which transitions the output signal to the fourth level indicative of the failure state.

The bias current diagnostic circuit 1067 is coupled to a bias current source 1065 to measure a voltage across a resistor within the bias current diagnostic circuit 1067 to determine an amount of current generated by the bias current source 1065. A failure state is indicated when the current generated by the bias current source 1065 is less than a predetermined threshold value by outputting a diagnostic signal that is received at the controller 1050.

The over-frequency diagnostic circuit 1073 is coupled to, or in some cases included within, the digital controller 1050 to receive and determine a frequency of the one or more magnetic field signals to ensure that the frequency does not exceed a predetermined frequency (for example, 15 KHz) for more than a predetermined number of pulses (for example, 15 pulses). A failure state is indicated when the frequency exceeds the predetermined frequency for more than the predetermined number of pulses.

The output collision diagnostic circuit 1074 is coupled to, or in some cases included within, the digital controller 1050 and is configured to monitor an output of the controller to determine a number of collisions that occur between pulses of the output signal (as can occur where wider pulse widths are used to convey certain rotation direction information) to ensure that the number of collisions do not occur beyond the maximum operational frequency of the device. If a number of collisions occur that exceeds a predetermined number (for example, three) of consecutive collisions, a failure state is indicated.

The output current source diagnostic circuit 1082 is coupled to an output current source 1080 to monitor a level of the current pulses of the output signal and compare the level of the current pulses of the output signal to a desired current level. The failure state is indicated when the level of the current pulses of the output signal is not at the desired current level.

FIG. 11 is a graph showing a magnetic field signal 1110 and an example of a corresponding output signal 1120 indicative of a speed and/or a direction of a rotation of a ferromagnetic object and including a failure state output where the failure is recoverable. The graph has horizontal dimensions in arbitrary units of time and vertical dimensions in arbitrary units of amplitude. The magnetic field signal 1110 can be the same as or similar to one of the signals output by the front-end amplifier 1021, 1031 of FIG. 10 generated by one or more magnetic field sensing elements (1011, 1012, 1013 of FIG. 10). The output signal 1120 is a pulse-width modulated signal comprised of a plurality of pulses with a failure state output where the device recovers from the failure state and returns to normal operation. The width of the pulse of the failure state output determines the type of failure as either warning or critical. The output signal 1120 includes at least four different output levels 1121, 1122, 1123, and 1124, with a fourth output level 1124 indicative of the failure state. The failure state can be output in response to a diagnostic failure received from any one or more of the diagnostic circuits shown in FIG. 10 (1015, 1025, 1026, 1035, 1036, 1062, 1064, 1067, 1073, 1074, 1082).

After a failure state (whether critical or warning) the device will attempt to recover. More particularly, the device will attempt a recovery after the failure state has been indicated for a predetermined duration based on the failure type. For example, the failure state communicated at pulse 1140 may correspond to a warning type of failure mode in which case the sensor will attempt a recovery from the fault state after a first predetermined duration. Alternatively for example if the failure state corresponds to a critical type of failure mode, then in which case the sensor will attempt a recovery from the fault state after a second predetermined duration. It will be appreciated that under conditions when the fault state is recoverable, the duration of the failure state can be used (e.g., by external controllers or systems) to determine the failure type. In FIG. 11, the failure is recoverable, however in FIG. 12 the failure is not recoverable. After the recoverable failure, the controller uses the duration of the failure state can be used to determine the type of failure, as will be appreciated in light of the present disclosure.

The output signal 1120 is comprised of a plurality of pulses. Tallest pulses 1131, 1137 (speed pulses) can be indicative of a passing feature (e.g., a gear tooth) of a ferromagnetic object (such as the ferromagnetic object 12 or 60 shown in FIG. 1). Thus, a rate of the speed pulses 1131, 1137 can be indicative of a speed of movement (e.g., a speed of rotation) of the ferromagnetic object. Further, a pulse width of the speed pulses 1131, 1137 can be indicative of a direction of movement (e.g., rotation) of the ferromagnetic target object, as will be appreciated in light of the present disclosure. The height of the pulses 1131, 1137 can be indicative of a predetermined magnitude of current, for example, in a two terminal (i.e., two wire) magnetic field sensor with an associated two wire communication scheme. In other arrangements, the height of speed pulses 1131, 1137 can be indicative of a predetermined magnitude of voltage, for example, in a three terminal (i.e., three wire) magnetic field sensor with an associated three wire communication scheme.

High resolution pulses 1132, 1134, 1135, 1136 between the speed pulses 1131, 1137 can have pulse widths indicative of pulse width modulation (PWM) in accordance with the values of the signal 1110. In some embodiments, the PWM sweeps in accordance with an instantaneous value of the sinusoid 1110. Here, high resolution pulses 1132, 1134, 1135, 1136 are shortest as the signal 1110 achieves a minimum value and pulses are longest as the signal 1110 achieves a maximum value. In other embodiments, the opposite can be arranged. It will be appreciated that although the speed pulses 1131, 1137 are shown to have a larger amplitude than the PWM high resolution pulses 1132, 1134, 1135, 1136, in other embodiments the pulses can all have the same amplitude. In some embodiments, there can be at least one, at least two, at least three, at least four, at least five, at least six, at least seven, at least eight, at least nine, at least ten, or more than ten PWM high resolution pulses 1132, 1134, 1135, 1136 in each cycle of the signal 1110, or alternately in each half cycle of the signal 1110. Since each pulse includes two state transitions, there can be at least two, at least four, at least six, at least eight, at least ten, at least twelve, at least fourteen, at least sixteen, at least eighteen, at least twenty, or more than twenty PWM high resolution pulse transitions in each cycle of the signal 1110, or alternately, in each half cycle of the signal 1110.

The output signal 1120 also includes a pulse 1140 at a fourth output level 1124 that is used to indicate a failure state for the magnetic field sensor. The pulse width 1142 of the pulse 1140 can be used to determine whether the failure is a critical failure or a warning failure. The device is able to recover from the failure. As shown in FIG. 11, the plurality of state transitions of the output signal 1120 includes at least one first state transition between the first level 1121 and the second level 1122, at least one second state transition between the first level 1121 and the third level 1123, and at least one third state transition to the fourth level 1124 that is lower than the first level 1121, the second level 1122, and the third level 1123. The fourth level 1124 is indicative of a failure state of the magnetic field of the sensor, the type of failure state depending upon the width 1142 of the pulse 1140. In an example embodiment, when the width 1142 of the pulse is at least 75 microseconds this is indicative of a warning state and when the width 1142 of the pulse is at least 5,000 microseconds this is indicative of a critical state for the type of failure. The failure state can result from a warning or critical failure according to any one or more of the diagnostic circuits disclosed herein.

It will be appreciated in light of the present disclosure that although only two types of failure states (critical or warning) are shown and described, the techniques are likewise applicable to more than two types of failures. For example, there can be three or more different pulse width values for the pulse width 1142 that can be used to determine if the failure is a critical type, warning type, or another type of failure for the system. Further, although the fourth level is shown as being lower in value than the first, second, and third levels, the failure indication could be at any separate level, other than the first, second or third levels. For example, the fourth level could be higher than the third level, or in between either the first and second level, or the second and third level.

Figure 12:
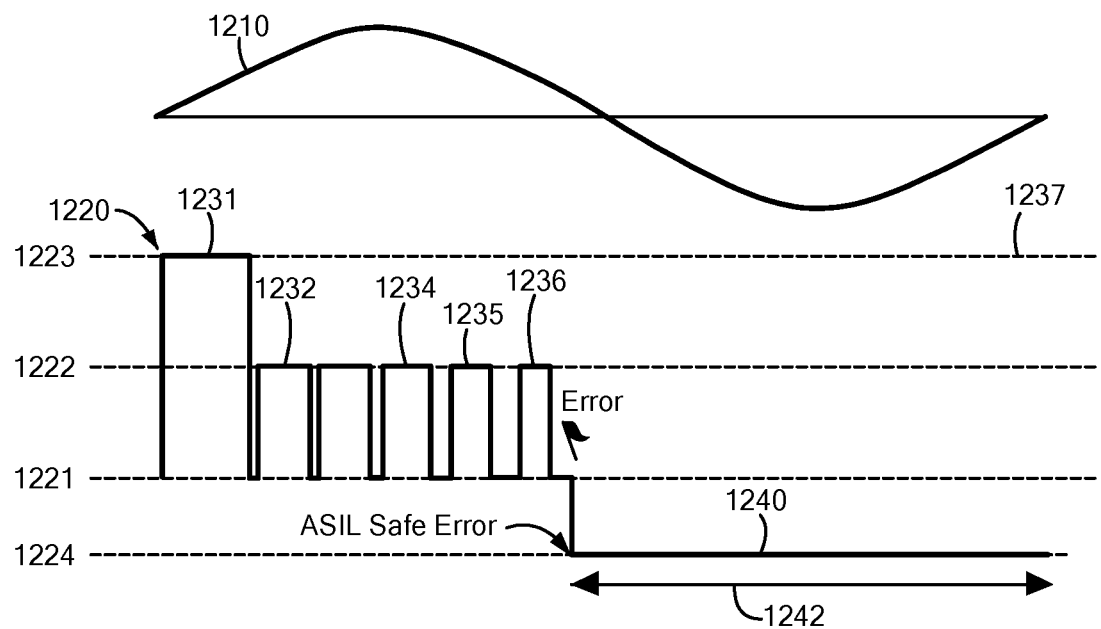
FIG. 12 is a graph showing a magnetic field signal and another example of a corresponding output signal indicative of a speed and/or a direction of a rotation of a ferromagnetic object and including a failure state output where the failure is not recoverable.

FIG. 12 is a graph showing a magnetic field signal 1210 and another example of a corresponding output signal 1220 indicative of a speed and/or a direction of a rotation of a ferromagnetic object and including a failure state output where the failure is not recoverable. The graph has horizontal dimensions in arbitrary units of time and vertical dimensions in arbitrary units of amplitude. The magnetic field signal 1210 can be the same or similar to one of the signals output by the front-end amplifier 1021, 1031 of FIG. 10 generated by one or more magnetic field sensing elements (1011, 1012, 1013 of FIG. 10). The output signal 1220 is a pulse-width modulated magnetic field signal comprised of a plurality of pulses with a failure state output where the device does not recover from the failure. The output signal 1220 includes at least four different output levels 1221, 1222, 1223, and 1224, with the fourth output level 1224 being indicative of a failure state. The failure state can result from a warning or critical failure according to any one or more of the diagnostic circuits disclosed herein.

The output signal 1220 is comprised of a plurality of pulses. The tallest pulse 1231 can be indicative of a passing feature (e.g., a gear tooth) of a ferromagnetic object.

The output signal 1220 also includes a pulse 1240 at a fourth output level 1224. The fourth output level is used to indicate a failure state of the magnetic field sensor. As shown in FIG. 12, the pulse 1240 has a pulse width 1242 that indicates that the device has not recovered from the type of failure. It will be appreciated that the type of failure can be determined when the device is able to recover from the failure based on the duration of the failure detection, as shown for example in FIG. 11, and not when the device is not able to recover, as shown in FIG. 12. The plurality of state transitions of the output signal 1220 includes at least one first state transition between the first level 1221 and the second level 1222, at least one second state transition between the first level 1221 and the third level 1223, and at least one third state transition to the fourth level 1224 that is lower than the first level 1221, the second level 1222 and the third level 1223. The fourth level 1224 is indicative of a failure state of the magnetic field of the sensor.

Figure 13:
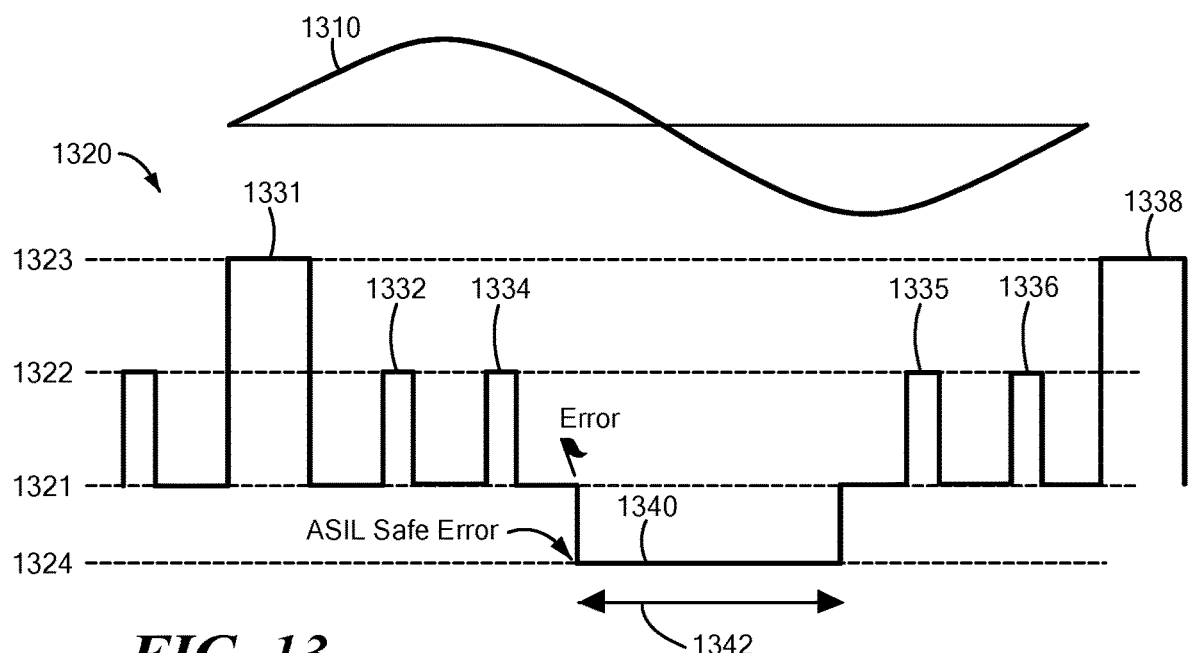
FIG. 13 is a graph showing a magnetic field signal and another example of a corresponding output signal indicative of a speed and/or a direction of a rotation of a ferromagnetic object and including a failure state output where the failure is recoverable.

FIG. 13 is a graph showing a magnetic field signal 1310 and another example of a corresponding output signal 1320 indicative of a speed and/or a direction of a rotation of a ferromagnetic object and including a failure state output where the failure is recoverable. The graph has horizontal dimensions in arbitrary units of time and vertical dimensions in arbitrary units of amplitude. The magnetic field signal 1310 can be the same as or similar to one of the signals output by the front-end amplifier 1021, 1031 or FIG. 10 generated by one or more magnetic field sensing elements (1011, 1012, 1013 of FIG. 10). The output signal 1320 comprises a plurality of pulses with a failure state output where the device recovers from the failure state and returns to normal operation.

The signal 1320 includes pulses 1231, 1237 (speed pulses) that can be indicative of a passing feature (e.g., a gear tooth) of a ferromagnetic object (such as ferromagnetic object 12 or 60 of FIG. 1). Thus, a rate of the speed pulses 1131, 1137 can be indicative of a speed of movement (e.g., a speed of rotation) of the ferromagnetic object. Further, a pulse width of the speed pulses 1131, 1137 can be indicative of a direction of movement (e.g., rotation) of the ferromagnetic target object, as will be appreciated in light of the present disclosure. The height of the pulses 1131, 1137 can be indicative of a predetermined magnitude of current, for example, in a two terminal (i.e., two wire) magnetic field sensor with an associated two wire communication scheme. In other arrangements, the height of speed pulses 1131, 1137 can be indicative of a predetermined magnitude of voltage, for example, in a three terminal (i.e., three wire) magnetic field sensor with an associated three wire communication scheme.

The signal 1320 includes a fixed number of high resolution pulses 1332, 1332, 1335, 1336 each having equal pulse width. The high-resolution pulses 1332, 1334, 1335, 1336 can be arranged to fill a time between the speed pulses 1331, 1338. Thus, the high-resolution pulses 1332, 1334, 1335, 1336 can compress together or expand apart relative to each other depending upon a rate of the speed pulses 1331, 1338. In some embodiments, the high-resolution pulses 1332, 1334, 1335, 1336 can be equally spaced in time. In other embodiments, the high-resolution pulses 1332, 1334, 1335, 1336 are not equally spaced in time, but are instead a fixed number of pulses.

In some embodiments, there can be at least one, at least two, at least three, at least four, at least five, at least six, and leave seven, at least eight, at least nine, at least ten, or more than ten fixed number of high resolution pulses 1332, 1334, 1335, 1336 in each cycle of the signal 1310, or alternately, in each half cycle of the signal 1310. Since each pulse includes two state transitions, there can be at least two, at least four, at least six, at least eight, at least ten, at least twelve, at least fourteen, at least sixteen, at least eighteen, at least twenty, or more than twenty high resolution pulse transitions in each cycle of the signal 1310, or alternately in each half cycle of the signal 1310. As shown, the speed pulses 1331, 1338 occur once per cycle of the signal 1310. However, in other embodiments, there can be two speed pulses in each cycle of the signal 1310 and the high-resolution pulses can be between the two speed pulses per cycle. In some embodiments, the high-resolution pulses can have first pulse width when the ferromagnetic object rotates in a first direction and a second different pulse width when the ferromagnetic object rotates in a second different direction. In some embodiments, the speed pulses 1331, 1338 can be omitted.

The output signal 1320 includes a pulse 1340 at a fourth output level 1324. The fourth output level 1324 is used to indicate a failure state for the magnetic field sensor. The pulse width 1342 of the pulse 1340 indicates whether the failure is a critical failure or a warning failure. Note that the pulse width 1342 of the pulse 1340 is, for example, wider than the pulse width 1142 of pulse 1140. As such, the pulse width 1342 could be indicative of a critical failure having a pulse width of 5,000 microseconds, whereas pulse width 1142 (in FIG. 11) could be indicative of a warning failure having a pulse width of 75 microseconds, for example.

As shown in FIG. 13, the device is able to recover from the failure. The plurality of state transitions of the output signal 1320 includes at least one first state transition between the first level 1321 and the second level 1322, at least one second state transition between the first level 1321 and the third level 1323, and at least one third state transition to the fourth level 1324 that is lower than the first level 1321, the second level 1322, and the third level 1323. The fourth level 1324 is indicative of a failure state of the magnetic field sensor, depending upon the width 1342 of the pulse 1340. In embodiments, when the width 1342 of the pulse 1340 is at least 75 microseconds this is indicative of a warning state and when the width 1342 of the pulse 1340 is at least 5,000 microseconds this is indicative of a critical state for the type of failure. The failure state can result from a warning or critical failure according to any one or more of the diagnostic circuits disclosed herein.

Figure 14:
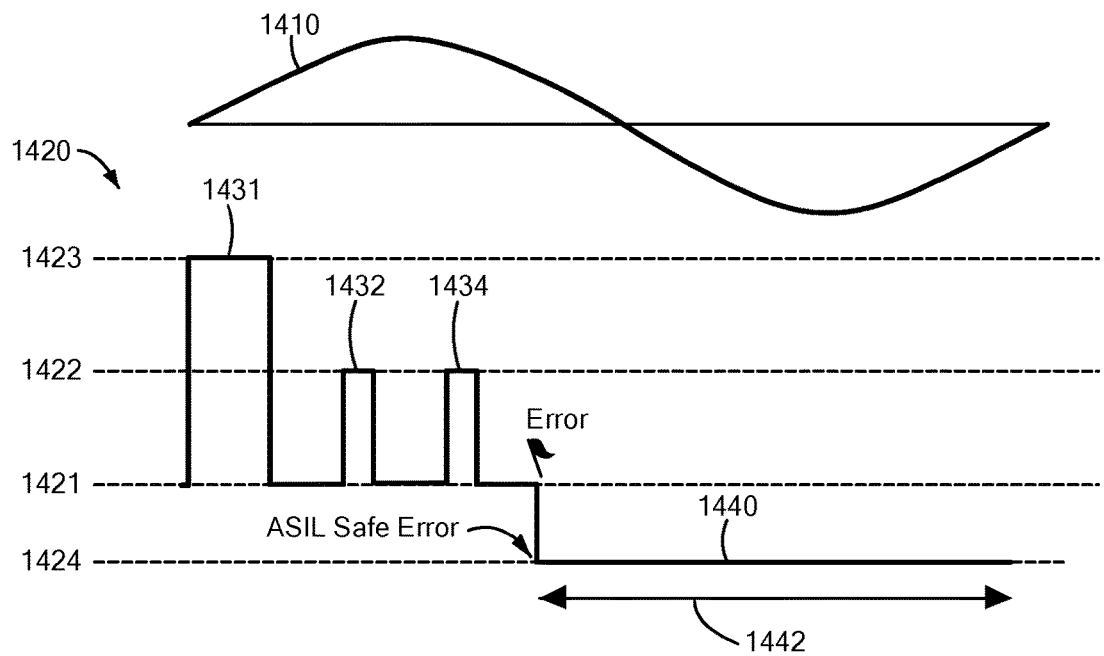
FIG. 14 is a graph showing a magnetic field signal and another example of a corresponding output signal indicative of a speed and/or a direction of a rotation of a ferromagnetic object and including a failure state output where the failure is not recoverable.

FIG. 14 is a graph showing a magnetic field signal 1410 and another example of a corresponding output signal 1420 indicative of a speed and/or a direction of a rotation of a ferromagnetic object and including a failure state output where the failure is not recoverable. The graph has horizontal dimensions in arbitrary units of time and vertical dimensions in arbitrary units of amplitude. The magnetic field signal 1410 can be the same or similar to one of the signals output by the front-end amplifier 1021, 1031 of FIG. 10 generated by one or more magnetic field sensing elements (1011, 1012, 1013 of FIG. 10). The output signal 1420 is a magnetic field signal comprised of a plurality of pulses with a failure state output where the device does not recover from the failure. The output signal 1420 includes at least four different output levels 1421, 1422, 1423, and 1424, with the fourth output level 1424 being indicative of a failure state. The failure state can result from a warning or critical failure according to any one or more of the diagnostic circuits disclosed herein.

The output signal 1420 is comprised of a plurality of pulses. The tallest pulse 1431 is indicative of pulses generated by a magnetic field sensor (i.e., by the digital controller 1050 of FIG. 1 and indicative of a passing feature (e.g., a gear tooth) on a ferromagnetic object.

The output signal 1420 also includes a pulse 1440 at a fourth output level 1424. The fourth output level is used to indicate a failure state of the magnetic field sensor. As shown in FIG. 14, the pulse 1440 has a pulse width 1442 that indicates that the device has not recovered from the type of failure. It will be appreciated that the type of failure can be determined when the device is able to recover from the failure, as shown for example in FIGS. 11 and 13. As shown in FIG. 14, the plurality of state transitions of the output signal 1420 includes at least one first state transition between the first level 1421 and the second level 1422, at least one second state transition between the first level 1421 and the third level 1423, and at least one third state transition to the fourth level 1424 that is lower than the first level 1421, the second level 1422 and the third level 1423. The fourth level 1424 is indicative of a failure state of the magnetic field of the sensor.

Figure 15:
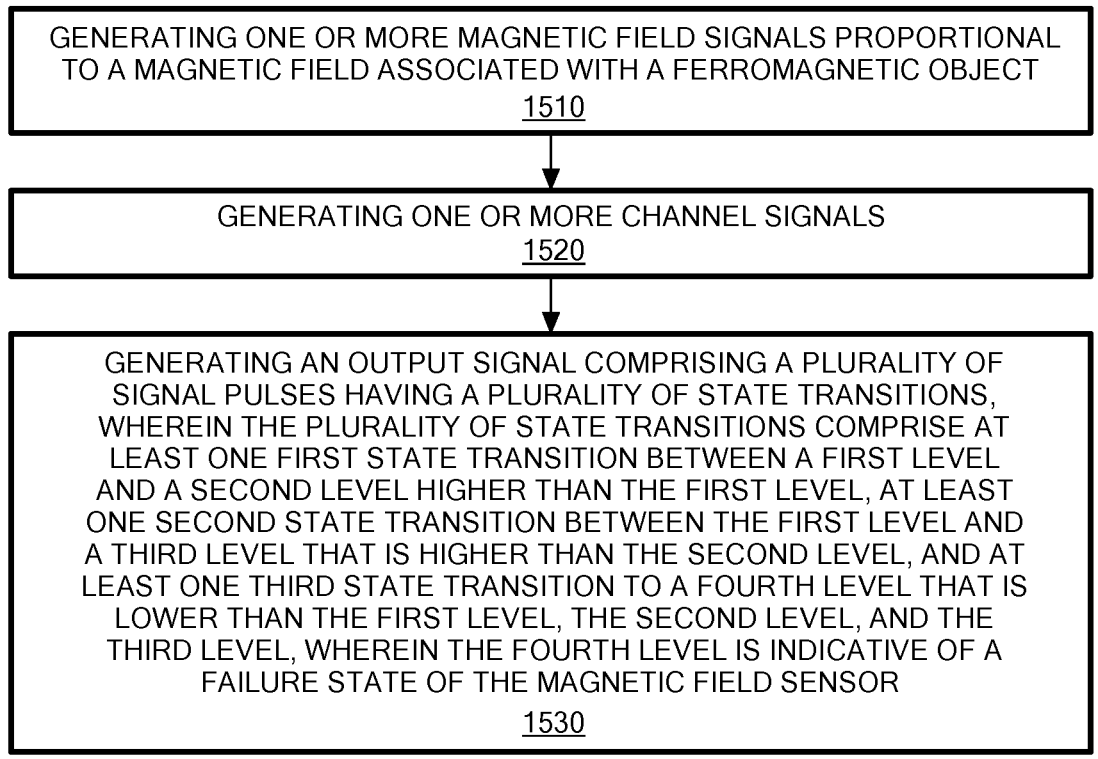
FIG. 15 is a flow chart illustrating a process for generating an output signal having a plurality of signal pulses including at least four levels of state transitions.

FIG. 15 is a flow chart illustrating a process for generating a sensor output signal having a plurality of signal pulses including at least four levels of state transitions. The process starts at block 1510 by generating one or more magnetic field signals proportional to a magnetic field associated with a ferromagnetic object. These one or more magnetic field signals can, for example, be the same or similar to one of the signals output by the front-end amplifier 1021, 1031 of FIG. 10.

At block 1520, one or more channel signals are generated. These, for example, can be the left channel signal output by the channel circuit 1020 and the right channel signal output by the channel circuit 1030 shown in FIG. 10.

At block 1530, a sensor output signal is generated from the one or more channel signals. The output signal comprises a plurality of signal pulses having a plurality of state transitions comprising at least one first state transition between a first level and a second level higher than the first level (for example from level 1121 to level 1122 in FIG. 11), at least one second state transition between the first level and a third level that is higher than the second level (for example, from level 1121 to level 1123 in FIG. 11), and at least one third state transition to a fourth level (for example, level 1124) that is lower than the first level, the second level and the third level. The fourth level is indicative of a failure state of the magnetic field sensor, as will be appreciated in light of the present disclosure.

Figure 16:
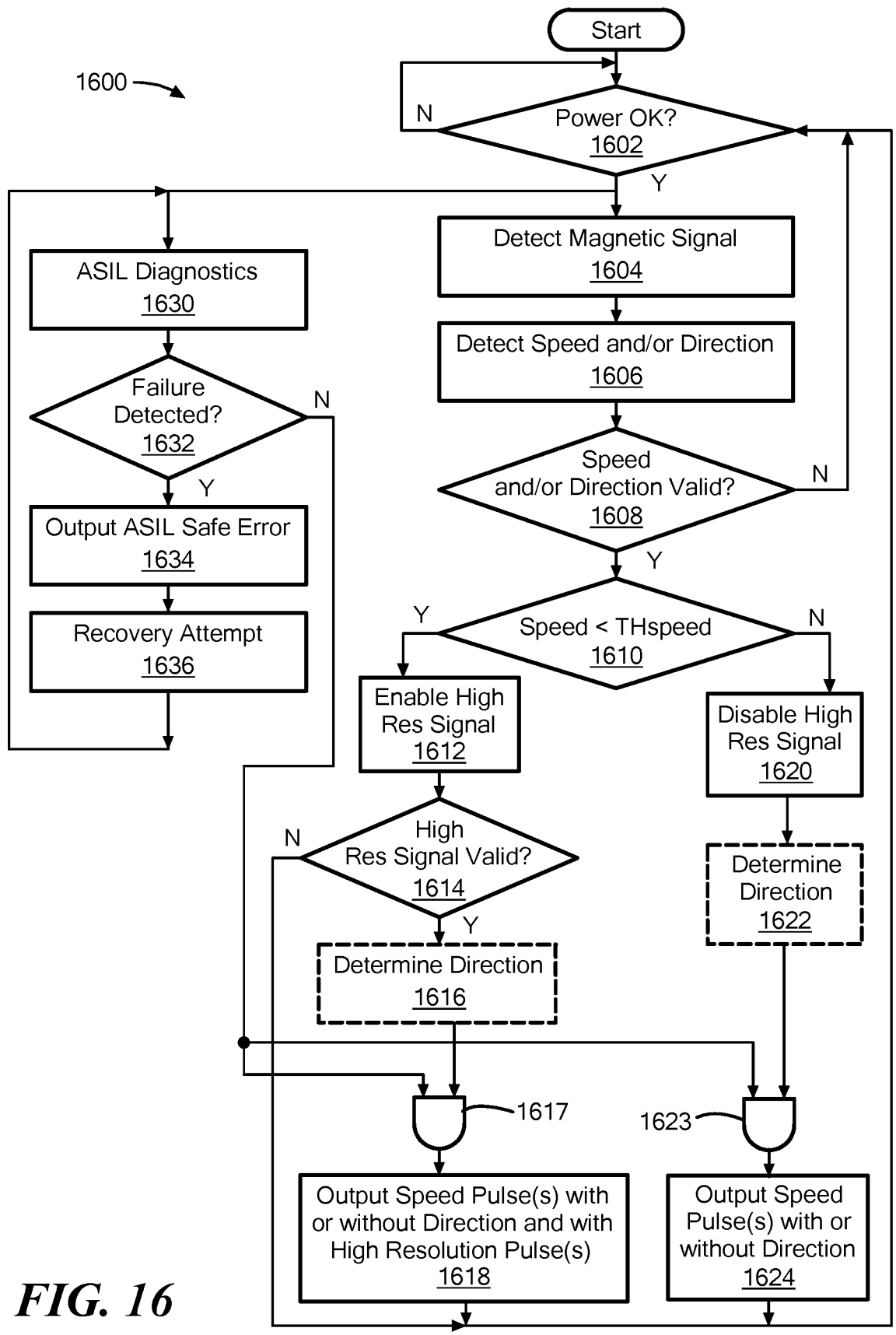
FIG. 16 is a flow chart showing a process that can be used in a magnetic field sensor to generate speed and/or direction information and also higher resolution pulses, as well as diagnostics to indicate a failure state.

Referring now to FIG. 16, a process 1600, as shown, at relatively low speeds of rotation of the ferromagnetic object 12 (or 60) of FIG. 1, provides high resolution pulses between speed pulses in accordance with FIGS. 3-9 and 11-14. The high resolution pulses can be omitted and the speed pulses can be retained above a predetermined rotation speed of the rotating ferromagnetic object 12 (or 60) of FIG. 1. The magnetic field sensor 1000 (FIG. 10) is used in examples below. However any of the magnetic field sensors including diagnostic circuits can perform the method 1600.

At block 1602, the magnetic field sensor, e.g., 1000, tests that the power supply to the magnetic field sensor is within acceptable limits. If the power supply is within the acceptable limits, then the process proceeds to block 1604.

At block 1604 the magnetic field sensor 1000 detects the magnetic field signals, e.g., the magnetic field signals 1110, 1210, 1310, or 1410. At block 1606, the magnetic field sensor 1000 detects rotation speed and/or direction of the ferromagnetic object 12 (or 60) of FIG. 1. At block 1608 the magnetic field sensor 1000 identifies if the speed and/or direction is/are valid.

In some embodiments, at block 1608, the magnetic field sensor 1000 can detect a vibration in the movement of the ferromagnetic object 12 (or 60) of FIG. 1. Some techniques for vibration detection are described in U.S. Pat. No. 7,772,838, issued Aug. 10, 2010, which is assigned to the assignee of the present disclosure, and which is incorporated by reference herein in its entirety. If a vibration is detected, the signals in the magnetic field sensor can be deemed to be invalid, in which case the method can return to block 1602. If the speed and/or direction are valid, then the process proceeds to block 1610.

At block 1610 the magnetic field sensor detects whether the rotational speed of the ferromagnetic object 12 (or 60) of FIG. 1 is less than a threshold speed, for example, one thousand RPM.

If the rotation speed is less than the threshold speed, then the process proceeds to block 1612, at which the high resolution signal is enabled. At block 1614, it is detected if the high resolution signal is valid. If the high resolution signal is valid, then the process proceeds to block 1616. At block 1616, optionally, the magnetic field sensor can identify the direction of rotation. The output of block 1616 is gated, for example via AND gate 1617, by a failure detection (from block 1632) from one or more of the diagnostic circuits. If no failure is detected, the process is allowed to proceed to block 1618.

At block 1618 speed pulse(s) with or without direction information, along with high resolution output pulse(s), are generated.

At block 1610, if the rotation speed is not less than the threshold speed then the process proceeds to block 1620. At block 1620, the high resolution signal is disabled, leaving only speed pulses, for example, the speed pulses 1131, 1137 of FIG. 11. At block 1622, optionally, the magnetic field sensor can identify the direction of rotation. The output of block 1622 is gated via AND gate 1623 by a failure detection (from block 1632) from one or more diagnostic circuits. If no failure is detected, the process is allowed to proceed to block 1624. At block 1624 speed pulse(s) with or without direction information, are generated.

The appropriate diagnostics will also be initiated at block 1630, which can be by any of the appropriate diagnostic circuits illustrated in FIG. 10 (for example, 1015, 1025, 1035, 1026, 1036, 1062, 1067, 1073, 1074, or 1082). The diagnostics may be performed in parallel with the signal processing of 1604-1624. The digital controller 1050 checks to determine if a failure is detected at 1632. This can be accomplished for example by polling the diagnostic circuit outputs for example. If a failure is not detected, the output speed pulses are allowed to be output via AND gate 1617 at block 1618 or via AND gate 1623 at block 1624. However, if there is a failure detected at block 1632, then at block 1634 a failure state indication is output. A recovery attempt is then made at block 1636, and the system returns to diagnostics at block 1630.

U.S. application Ser. No. 15/596,514, entitled "Magnetic Field Sensors and Output Signal Formats For A Magnetic Field Sensor," which is assigned to the assignee of the present disclosure, is incorporated herein by reference in its entirety. All references cited herein are hereby incorporated herein by reference in their entirety.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:
1. A magnetic field sensor, comprising:
one or more magnetic field sensing elements operable to generate a respective one or more magnetic field signals proportional to a magnetic field associated with a ferromagnetic object capable of moving;
one or more circuit channels coupled to receive the one or more magnetic field signals, the one or more circuit channels configured to generate a respective one or more channel signals; and an electronic circuit coupled to receive the one or more channel signals and operable to generate an output signal comprising a plurality of signal pulses having a plurality of state transitions, the plurality of signal pulses representative of at least a rate of movement of the ferromagnetic object, wherein the plurality of state transitions comprises at least one first state transition between a first level and a second level that is higher than the first level, at least one second state transition between the first level and a third level that is higher than the second level, and at least one third state transition to a fourth level that is lower than the first level, the second level, and the third level, wherein the fourth level is indicative of a failure state of the magnetic field sensor.

2. The magnetic field sensor of claim 1, wherein each magnetic field signal has a plurality of magnetic field signal periods as the ferromagnetic object moves, wherein the plurality of signal pulses occurs within each one of the magnetic field signal periods, and wherein the plurality of state transitions comprises at least four state transitions.

3. The magnetic field sensor of claim 2, wherein the plurality of signal pulses comprise a plurality of PWM pulses.

4. The magnetic field sensor of claim 3, wherein the plurality of PWM pulses comprises a plurality of PWM pulses with pulse widths that change in relation to an amplitude of the magnetic field signals at times along the magnetic field signal.

5. The magnetic field sensor of claim 3, wherein the plurality of PWM pulses comprises a linear plurality of PWM pulses with pulse widths that change linearly within each magnetic field signal period.

6. The magnetic field sensor of claim 5, wherein the linear plurality of PWM pulses has first and second directions of pulse width changes with time, the first and second directions representative of first and second directions of motion of the ferromagnetic object.

7. The magnetic field sensor of claim 1, wherein the failure state comprises a warning state when a pulse width of a signal pulse of the output signal at the fourth level is less than a first predetermined value, and wherein the failure state comprises a critical state when a pulse width of a signal pulse of the output signal at the fourth level is less than a second predetermined value.

8. The magnetic field sensor of claim 7, wherein the first predetermined value is different from the second predetermined value.

9. The magnetic field sensor of claim 7, wherein the first predetermined value is less than the second predetermined value.

10. The magnetic field sensor of claim 7, wherein the first predetermined value is approximately 75 microseconds and the second predetermined value is approximately 5,000 microseconds.

11. The magnetic field sensor of claim 1, wherein the magnetic field sensor is configured to attempt a recovery from the failure state after a predetermined period of time.

12. The magnetic field sensor of claim 1, wherein at least one of the one or more circuit channels comprises a front-end amplifier and a front-end amplifier diagnostic circuit coupled to the front-end amplifier to monitor a voltage level associated with the front-end amplifier, wherein the fourth level of the output signal is indicative of a critical state for the failure state due to the voltage level falling outside of a desired range of operation.

13. The magnetic field sensor of claim 1, further comprising a voltage regulator and a voltage regulator diagnostic circuit coupled to the voltage regulator to monitor an operating voltage of the voltage regulator, wherein the fourth level of the output signal is indicative of a critical state for the failure state due to the operating voltage being less than a predetermined threshold value.

14. The magnetic field sensor of claim 1, further comprising a bias current source and a bias current diagnostic circuit coupled to measure a voltage across a resistor to determine a current generated by the bias current source, wherein the fourth level of the output signal is indicative of a critical state for the failure state due to the current generated by the bias current source being less than a predetermined threshold value.

15. The magnetic field sensor of claim 1, further comprising a magnetic field sensing element drive circuit and a magnetic field sensing element diagnostic circuit coupled to the magnetic field sensing elements to monitor a voltage across a resistor to determine a current generated by the magnetic field sensing element drive circuit, wherein the fourth level of the output signal is indicative of a critical state for the failure state due to the current generated by the magnetic field sensing element drive circuit being less than a predetermined threshold value.

16. The magnetic field sensor of claim 1, wherein the plurality of signal pulses of the output signal are current pulses, wherein the electronic circuit comprises an output current source to generate the plurality of signal pulses of the output signal, and wherein the electronic circuit comprises an output current source diagnostic circuit configured to monitor a level of the current pulses of the output signal and compare the level of the current pulses of the output signal to a desired current level, wherein the fourth level of the output signal is indicative of a critical state for the failure state due to the level of the current pulses of the output signal not being at a desired current level.

17. The magnetic field sensor of claim 1, wherein the electronic circuit comprises a filter saturation diagnostic circuit coupled to the one or more circuit channels to monitor the one or more channel signals, wherein the fourth level of the output signal is indicative of a critical state for the failure state due to a filter associated with the magnetic field signal becoming saturated.

18. The magnetic field sensor of claim 1, wherein the electronic circuit comprises a controller and an over-frequency diagnostic circuit coupled to the controller and to receive and determine a frequency of the one or more magnetic field signals, wherein the fourth level of the output signal is indicative of a warning state for the failure state due to the frequency of the one or more magnetic field signals exceeding a predetermined frequency for more than a predetermined number of pulses.

19. The magnetic field sensor of claim 1, wherein the electronic circuit comprises a controller and an output collision diagnostic circuit coupled to the controller and configured to monitor an output of the controller, wherein the fourth level of the output signal is indicative of a warning state for the failure state when three consecutive collisions occur in the output of the controller.

20. A method of indicating a failure state of a magnetic field sensor, comprising:
generating one or more magnetic field signals proportional to a magnetic field associated with a ferromagnetic object;

generating one or more channel signals with a respective one or more circuit channels coupled to receive the one or more magnetic field signals; and generating, with an electronic circuit coupled to the one or more circuit channels, an output signal comprising a plurality of signal pulses having a plurality of state transitions, the plurality of signal pulses representative of at least a rate of movement of the ferromagnetic object, wherein the plurality of state transitions comprises at least one first state transition between a first level and a second level that is higher than the first level, at least one second state transition between the first level and a third level that is higher than the second level, and at least one third state transition to a fourth level that is lower than the first level, the second level, and the third level, wherein the fourth level is indicative of a failure state of the magnetic field sensor.

21. The method of claim 20, wherein each magnetic field signal has a plurality of magnetic field signal periods as the ferromagnetic object moves, wherein the plurality of signal pulses occurs within each one of the magnetic field signal periods, and wherein the plurality of state transitions comprises at least four state transitions.

22. The method of claim 21, wherein the plurality of signal pulses comprise a plurality of PWM pulses.

23. The method of claim 20, wherein the failure state comprises a warning state when a pulse width of a signal pulse of the output signal at the fourth level is less than a first predetermined value, and wherein the failure state comprises a critical state when a pulse width of a signal pulse of the output signal at the fourth level is less than a second predetermined value.

24. An apparatus comprising:

means for generating one or more magnetic field signals proportional to a magnetic field associated with a ferromagnetic object;

means for generating one or more channel signals with a respective one or more circuit channels coupled to receive the one or more magnetic field signals; and means for generating, with an electronic circuit coupled to the one or more circuit channels, an output signal comprising a plurality of signal pulses having a plurality of state transitions, the plurality of signal pulses representative of at least a rate of movement of the ferromagnetic object, wherein the plurality of state transitions comprises at least one first state transition between a first level and a second level that is higher than the first level, at least one second state transition between the first level and a third level that is higher than the second level, and at least one third state transition to a fourth level that is lower than the first level, the second level, and the third level, wherein the fourth level is indicative of a failure state of the magnetic field sensor.

* * * * *

UNITED STATES PATENT AND TRADEMARK OFFICE
CERTIFICATE OF CORRECTION

PATENT NO. : 10,656,170 B2  
APPLICATION NO. : 15/982268  
DATED : May 19, 2020  
INVENTOR(S) : Hyungsok Lim et al.

Page 1 of 1

It is certified that error appears in the above-identified patent and that said Letters Patent is hereby corrected as shown below:

In the Specification

Column 2, Line 67 delete "provides a information" and replace with --provides information--.

Column 9, Line 55 delete "trey" and replace with --trev--.

Column 9, Line 56 delete "trey" and replace with --trev--.

Column 9, Line 57 delete "trey" and replace with --trev--.

Column 9, Line 61 delete "trey" and replace with --trev--.

Column 9, Line 62 delete "trey" and replace with --trev--.

Column 10, Line 20 delete "trey" and replace with --trev--.

Column 10, Line 21 delete "trey" and replace with --trev--.

Column 10, Line 41 delete "trey" and replace with --trev--.

Column 10, Line 43 delete "trey" and replace with --trev--.

Column 21, Line 38 delete "1332, 1332," and replace with --1332, 1334,--.

Column 21, Lines 50-51 delete "and leave seven," and replace with --at least seven,--.

Signed and Sealed this  
Twenty-second Day of June, 2021

Drew Hirshfeld  
*Performing the Functions and Duties of the*  
*Under Secretary of Commerce for Intellectual Property and*  
*Director of the United States Patent and Trademark Office*